(12) United States Patent
Kenna

(10) Patent No.: US 11,570,933 B2
(45) Date of Patent: Jan. 31, 2023

(54) EXFOLIATED GRAPHITE MATERIALS AND COMPOSITE MATERIALS AND DEVICES FOR THERMAL MANAGEMENT

(71) Applicant: 0908905 B.C. LTD., Mission (CA)

(72) Inventor: John Kenna, Surrey (CA)

(73) Assignee: 0908905 B.C. Ltd., Delta (CA)

( * ) Notice: Subject to any disclaimer, the term of this patent is extended or adjusted under 35 U.S.C. 154(b) by 995 days.

(21) Appl. No.: 16/223,438

(22) Filed: Dec. 18, 2018

(65) Prior Publication Data

US 2019/0124793 A1  Apr. 25, 2019

Related U.S. Application Data

(63) Continuation of application No. 15/630,323, filed on Jun. 22, 2017, now Pat. No. 10,194,561, which is a
(Continued)

(51) Int. Cl.
*H05K 7/20* (2006.01)
*H01L 21/48* (2006.01)
(Continued)

(52) U.S. Cl.
CPC .......... *H05K 7/20509* (2013.01); *B23P 15/26* (2013.01); *B32B 3/266* (2013.01); *B32B 9/007* (2013.01); *F28F 1/14* (2013.01); *F28F 3/02* (2013.01); *F28F 21/02* (2013.01); *H01L 21/4871* (2013.01); *H01L 23/3672* (2013.01); *H01L 23/373* (2013.01); *H01L 23/433* (2013.01); *H05K 7/2039* (2013.01); *H05K 7/20472* (2013.01); *B23P 2700/10* (2013.01); *B32B 2264/108* (2013.01); *H01L 23/3677* (2013.01); *H01L 24/13* (2013.01);
(Continued)

(58) Field of Classification Search
CPC ............. H05K 7/20509; H05K 7/2039; H05K 7/20472; B23P 15/26; B23P 2700/10; B32B 3/266; B32B 9/007; F28F 1/14; F28F 3/02; F28F 21/02; H01L 21/4871; H01L 23/3672; H01L 23/373; H01L 23/433; H01L 23/3677; H01L 24/13; H01L 24/16; H01L 24/73; H01L 2224/13101; H01L 2224/16225; H01L 2224/73253; H01L 2924/0002; H01L 2924/16152; H01L 2924/16251; Y10T 29/4935
See application file for complete search history.

(56) References Cited

U.S. PATENT DOCUMENTS 3,404,061 A  10/1968  Shane et al.
3,494,382 A  2/1970  Shane et al.
(Continued)

FOREIGN PATENT DOCUMENTS

JP  2006064296 A  3/2006

*Primary Examiner* — Kyoung Lee
(74) *Attorney, Agent, or Firm* — Cook Alex Ltd.

(57) ABSTRACT

Exfoliated graphite materials, and composite materials including exfoliated graphite, having enhanced through-plane thermal conductivity can be used in thermal management applications and devices. Methods for making such materials and devices involve processing exfoliated graphite materials such as flexible graphite to orient or re-orient the graphite flakes in one or more regions of the material.

20 Claims, 29 Drawing Sheets

Related U.S. Application Data continuation of application No. 15/201,347, filed on Jul. 1, 2016, now Pat. No. 9,706,684, which is a continuation-in-part of application No. 14/583,402, filed on Dec. 26, 2014, now Pat. No. 9,700,968.

(60) Provisional application No. 62/035,210, filed on Aug. 8, 2014, provisional application No. 61/921,042, filed on Dec. 26, 2013.

(51) Int. Cl.

| | | |
|---|---|---|
| *B32B 3/26* | (2006.01) | |
| *B32B 9/00* | (2006.01) | |
| *F28F 21/02* | (2006.01) | |
| *B23P 15/26* | (2006.01) | |
| *F28F 3/02* | (2006.01) | |
| *F28F 1/14* | (2006.01) | |
| *H01L 23/367* | (2006.01) | |
| *H01L 23/373* | (2006.01) | |
| *H01L 23/433* | (2006.01) | |
| *H01L 23/00* | (2006.01) | |

(52) U.S. Cl.
CPC .............. *H01L 24/16* (2013.01); *H01L 24/73* (2013.01); *H01L 2224/13101* (2013.01); *H01L 2224/16225* (2013.01); *H01L 2224/73253* (2013.01); *H01L 2924/0002* (2013.01); *H01L 2924/16152* (2013.01); *H01L 2924/16251* (2013.01); *Y10T 29/4935* (2015.01)

(56) References Cited

U.S. PATENT DOCUMENTS

| | | |
|---|---|---|
| 4,723,783 A | 2/1988 | Belter et al. |
| 4,849,858 A | 7/1989 | Grapes et al. |
| 4,867,235 A | 9/1989 | Grapes et al. |
| 5,149,518 A | 9/1992 | Mercuri et al. |
| 5,834,337 A | 11/1998 | Unger et al. |
| 5,928,807 A | 7/1999 | Elias |
| 6,060,166 A | 5/2000 | Hoover et al. |
| 6,245,400 B1 | 6/2001 | Tzeng et al. |
| 6,413,663 B1 | 7/2002 | Mercuri |
| 6,413,671 B1 | 7/2002 | Mercuri et al. |
| 6,432,336 B1 | 8/2002 | Mercuri et al. |
| 6,468,686 B1 | 10/2002 | Mercuri et al. |
| 6,479,182 B1 | 11/2002 | Mercuri |
| 6,503,626 B1 | 1/2003 | Norley et al. |
| 6,503,652 B2 | 1/2003 | Reynolds, III et al. |
| 6,506,484 B1 | 1/2003 | Mercuri et al. |
| 6,517,964 B2 | 2/2003 | Mercuri |
| 6,521,369 B1 | 2/2003 | Mercuri et al. |
| 6,523,608 B1 | 2/2003 | Solbrekken et al. |
| 6,528,199 B1 | 3/2003 | Mercuri et al. |
| 6,548,156 B2 | 4/2003 | Mercuri et al. |
| 6,604,457 B2 | 8/2003 | Klug |
| 6,605,379 B1 | 8/2003 | Mercuri et al. |
| 6,613,252 B2 | 9/2003 | Norley et al. |
| 6,620,506 B2 | 9/2003 | Mercuri et al. |
| 6,649,102 B2 | 11/2003 | Davis et al. |
| 6,663,807 B2 | 12/2003 | Klug |
| 6,673,284 B2 | 1/2004 | Mercuri et al. |
| 6,673,289 B2 | 1/2004 | Reynolds, III et al. |
| 6,702,970 B2 | 3/2004 | Klug |
| 6,706,400 B2 | 3/2004 | Mercuri et al. |
| 6,716,381 B2 | 4/2004 | Klug |
| 6,746,771 B2 | 6/2004 | Ottinger et al. |
| 6,749,010 B2 | 6/2004 | Getz, Jr. et al. |
| 6,797,091 B2 | 9/2004 | Lines et al. |
| 6,818,165 B2 | 11/2004 | Gallagher |
| 6,884,745 B2 | 4/2005 | Yazici et al. |
| 6,902,841 B2 | 6/2005 | Mercuri et al. |
| 6,923,631 B2 | 8/2005 | Mercuri et al. |
| 6,960,402 B2 | 11/2005 | Yazici et al. |
| 7,108,917 B2 | 9/2006 | Klug |
| 7,182,898 B2 | 2/2007 | Klug |
| 7,186,309 B2 | 3/2007 | Mercuri et al. |
| 7,232,601 B2 | 6/2007 | Mercuri et al. |
| 7,280,359 B2 | 10/2007 | Fujiwara |
| 7,341,781 B2 | 3/2008 | Klug |
| 7,393,587 B2 | 7/2008 | Krassowski et al. |
| 7,420,810 B2 | 9/2008 | Reis et al. |
| 7,470,468 B2 | 12/2008 | Mercuri et al. |
| 7,758,783 B2 | 7/2010 | Shi et al. |
| 8,034,662 B2 | 10/2011 | Touzelbaev et al. |
| 8,067,091 B2 | 11/2011 | Brunovska et al. |
| 8,270,170 B2 | 9/2012 | Hughes et al. |
| 8,382,004 B2 | 2/2013 | Asmussen et al. |
| 8,537,553 B2 | 9/2013 | Mohammed et al. |
| 8,916,269 B2 | 12/2014 | Brunovska et al. |
| 9,140,362 B2 | 9/2015 | Potier |
| 9,700,968 B2 | 7/2017 | Kenna et al. |
| 9,706,684 B2 | 7/2017 | Kenna |
| 2001/0039701 A1 | 11/2001 | Lines et al. |
| 2002/0102321 A1 | 8/2002 | Davis et al. |
| 2002/0164483 A1 | 11/2002 | Mercuri et al. |
| 2002/0168526 A1 | 11/2002 | Mercuri et al. |
| 2002/0180094 A1 | 12/2002 | Gough et al. |
| 2002/0192457 A1* | 12/2002 | Temme .................... B32B 9/00 428/320.2 |
| 2002/0197476 A1 | 12/2002 | Mercuri et al. |
| 2003/0051797 A1 | 3/2003 | Lines et al. |
| 2004/0072055 A1 | 4/2004 | Getz et al. |
| 2004/0241397 A1 | 12/2004 | Klug et al. |
| 2005/0104243 A1 | 5/2005 | Mercuri et al. |
| 2005/0175838 A1 | 8/2005 | Greinke et al. |
| 2005/0189673 A1 | 9/2005 | Klug et al. |
| 2005/0208165 A1 | 9/2005 | Mercuri et al. |
| 2006/0068205 A1 | 3/2006 | Potier |
| 2006/0070720 A1 | 4/2006 | Capp et al. |
| 2006/0225874 A1 | 10/2006 | Shives et al. |
| 2007/0053168 A1 | 3/2007 | Sayir et al. |
| 2007/0158050 A1 | 7/2007 | Norley et al. |
| 2008/0160284 A1 | 7/2008 | Mercuri et al. |
| 2008/0186419 A1 | 8/2008 | Kim et al. |
| 2009/0301697 A1 | 12/2009 | Hirose |
| 2012/0061135 A1 | 3/2012 | Hill et al. |
| 2012/0087094 A1 | 4/2012 | Hill et al. |
| 2013/0099013 A1 | 4/2013 | Asmussen et al. |
| 2013/0242573 A1 | 9/2013 | Petrsoki et al. |
| 2014/0217575 A1 | 8/2014 | Hung |
| 2014/0287239 A1 | 9/2014 | Scurati et al. |
| 2015/0075762 A1 | 3/2015 | Narendra et al. |
| 2015/0189792 A1 | 7/2015 | Kenna et al. |
| 2016/0079144 A1 | 3/2016 | Scurati et al. |
| 2017/0006736 A1 | 1/2017 | Kenna |
| 2017/0067701 A1 | 3/2017 | Sun et al. |
| 2017/0157895 A1 | 6/2017 | Groll et al. |
| 2017/0348811 A1 | 12/2017 | Kenna et al. |

\* cited by examiner $\rho = 0.46 \text{ g/cm}^3$ $\rho = 1.02 \text{ g/cm}^3$

EXFOLIATED GRAPHITE MATERIALS AND COMPOSITE MATERIALS AND DEVICES FOR THERMAL MANAGEMENT

CROSS-REFERENCE TO RELATED APPLICATIONS

This application is a continuation of U.S. patent application Ser. No. 15/630,323 filed on Jun. 22, 2017, entitled "Exfoliated Graphite Materials and Composite Materials and Devices for Thermal Management". The '323 application is a continuation of and claims priority benefits from U.S. patent application Ser. No. 15/201,347 filed on Jul. 1, 2016, entitled "Exfoliated Graphite Materials and Composite Materials and Devices for Thermal Management". The '347 application is a continuation-in-part of U.S. application Ser. No. 14/583,402 filed on Dec. 26, 2014, entitled "Apparatus and Methods for Processing Exfoliated Graphite Materials". The '402, '347, and '323 applications and this application claim priority benefits from U.S. provisional patent application No. 61/921,042 filed on Dec. 26, 2013, entitled "System and Method for Heat Dissipation Using Graphite Materials" and from U.S. provisional patent application No. 62/035,210 filed on Aug. 8, 2014, entitled "Apparatus and Methods for Processing of Exfoliated Graphite Material". The '323, '347, '402, '042, and '210 applications are incorporated by reference herein in their entireties.

With respect to the above-mentioned applications, to the extent any amendments, characterizations or other assertions previously made in any such related patent applications or patents, including any parent, co-pending or continuing application with respect to any art, prior or otherwise, could be construed as a disclaimer of any subject matter supported by the disclosure of the present application, such disclaimer is hereby rescinded and retracted. Prior art previously considered in any related patent application(s) or patent(s), including any parent, co-pending or continuing application, should be reconsidered with respect to the subject matter being claimed in the present application.

Field of the Invention

The present invention relates to exfoliated graphite materials, and composite materials comprising exfoliated graphite, for use in thermal management applications and devices. It also relates to methods for making such materials and devices.

Background of the Invention

Exfoliated graphite can be obtained by first intercalating natural graphite with an intercalating agent to form a graphite intercalation compound that is then exposed to a thermal shock, for example, at a temperature of 700° C.-1,050° C. for a short duration of time (20-60 seconds) to expand or exfoliate the graphite. Exfoliated graphite particles are vermiform in appearance, and are commonly referred to as "worms". The worm is a network of interconnected, thin graphite flakes, with pores present between flakes that make the worms compressible. FIG. 1 is a scanning electron microscope image illustrating the structure of exfoliated graphite.

Exfoliated graphite can be compressed to form a low density mat, or to form sheets of higher density material, referred to as "flexible graphite" or "exfoliated graphite sheet" or "graphite sheet". A calendering process, where exfoliated graphite material is fed through a series of drums or rollers in a process that gradually brings the material to a desired thickness and density range, can be used for forming flexible graphite. Flexible graphite can be mechanically processed, formed and/or cut into various shapes, and generally can be wound up on a drum to form a roll. A typical process for the preparation of flexible graphite from expanded or exfoliated graphite particles is described in U.S. Pat. No. 3,404,061. Flexible graphite typically has a density in the range of about 0.2 g/cm$^3$ to about 1.9 g/cm$^3$, and is commonly available at densities in the range of 0.7 g/cm$^3$ to 1.4 g/cm$^3$ (the theoretical maximum density being 2.26 g/cm$^3$). Calendering or compression forming steps can also be used to emboss features on one or both surfaces of flexible graphite sheet material that are suitable for its end-use application.

FIGS. 2A and 2B are scanning electron microscope images illustrating exfoliated graphite sheet materials (flexible graphite) of a lower density structure and a higher density structure, respectively. The lower density structure of FIG. 2A has a density of approximately 0.46 g/cm$^3$. The higher density structure of FIG. 2B has a density of approximately 1.02 g/cm$^3$.

Most of the graphite flakes in flexible graphite are oriented parallel to the two opposed major exterior surfaces. Although flexible graphite is typically highly electrically conductive (typically around 1,300 S/cm) in the in-plane directions, the through-plane electrical conductivity of flexible is significantly less (often only about 15 S/cm). The anisotropy ratio, the ratio of highest electrical conductivity to lowest conductivity values, is typically as high as 86:1 (and often higher than this value). The thermal properties of conventional flexible graphite are similarly highly anisotropic with the in-plane thermal conductivity being many times greater than the through-plane conductivity.

The properties of flexible graphite can be adjusted by incorporating a resin during forming of the material or impregnating it with a resin or another suitable impregnation medium after it is formed. The impregnation medium at least partially fills the pores between the graphite flakes. Resins suitable for impregnation of flexible graphite include phenolic, furan, epoxy and acrylic resins. Other additives are sometimes incorporated into flexible graphite.

For thermal management applications, such as heat sinks, heat spreaders and thermal interfaces, flexible graphite offers many advantages over other materials that are commonly used in these applications such as copper, steel and aluminum. For example, relative to these metals, flexible graphite is generally lighter, less susceptible to corrosion, has lower thermal expansion and has higher thermal conductivity in the in-plane direction.

SUMMARY OF THE INVENTION

A composite material or article comprises: a first perforated material having a first and a second major surface and at least one aperture, and a flexible graphite material comprising graphite flakes. The first perforated material is embedded in a surface of a flexible graphite material so that the first major surface of the first perforated material is in contact with the surface of the flexible graphite material, and a first portion of the flexible graphite material occupies the at least one aperture in the first perforated material.

In some embodiments of the composite material or article, the proportion of the graphite flakes in the first portion of the flexible graphite that are oriented in a through-plane direction is greater than the proportion of the graphite flakes in the remainder of the flexible graphite material that are oriented in a through-plane direction.

In some embodiments of the composite material or article, embedding the first perforated material in a surface of the flexible graphite material increases the through-plane conductivity of the flexible graphite material.

In some embodiments of the composite material or article, the flexible graphite material is a flexible graphite sheet material having first and second major surfaces, and the first perforated material is embedded in the first major surface of the flexible graphite sheet material so that the first major surface of the first perforated material is in contact with the first major surface of the flexible graphite sheet material.

In some embodiments of the composite material or article, the first portion of the flexible graphite material occupies the at least one aperture in the first perforated material so that it is flush with the second major surface of the first perforated material.

In some embodiments of the composite material or article, the first portion of the flexible graphite material occupies the at least one aperture in the first perforated material so that it protrudes beyond the second major surface of the first perforated material.

In some embodiments, the flexible graphite material is a flexible graphite sheet material having first and second major surfaces, and the composite material or article further comprises a second perforated material having a first and a second major surface and at least one aperture. The second perforated material is embedded in the second major surface of the flexible graphite sheet material so that the first major surface of the second perforated material is in contact with the second major surface of the flexible graphite material, and a second portion of the flexible graphite sheet material occupies the at least one aperture in the second perforated material.

In some embodiments, the proportion of the graphite flakes in the second portion of flexible graphite that are oriented in a through-plane direction is greater than the proportion of the graphite flakes in the flexible graphite sheet material that is located between the first major surfaces of the first and second perforated materials that are oriented in a through-plane direction.

Various thermal management devices can comprise the embodiments of the above-described composite materials. For example thermal pads, a thermal panels, heat dissipating enclosures for power electronics, heat sinks, and lids for electronic device or integrated circuits can comprise embodiments of the above composite materials. The thermal management device can be placed in operative contact with a heat source.

A method for making a composite material or article comprises embedding a first perforated material having at least one aperture in a first major surface of a flexible graphite material, so that a first major surface of the first perforated material is in contact with a surface of the flexible graphite material and so that a first portion of the flexible graphite material occupies the at least one aperture in the first perforated material. The flexible graphite material comprises graphite flakes predominantly oriented in an in-plane direction. Embedding the first perforated material in the first major surface of the flexible graphite material re-orients graphite flakes within the at least one aperture of the first perforated material to be out-of-plane. In some embodiments of the method, a significant portion are re-oriented to a substantially through-plane direction.

In some embodiments of the method, the flexible graphite material is a flexible graphite sheet material having first and second major surfaces. The method comprises embedding the first perforated material in the first major surface of the flexible graphite sheet material, so that the first major surface of the first perforated material is in contact with the first major surface of the flexible graphite sheet material.

In some embodiments of the method, embedding the first perforated material in the first major surface of the flexible graphite sheet increases the through-plane thermal conductivity of the flexible graphite sheet.

In some embodiments of the method, the first portion of the flexible graphite material occupies the at least one aperture in the first perforated material so that it is flush with a second major surface of the first perforated material. In some embodiments of the method, the first portion of the flexible graphite material occupies the at least one aperture in the first perforated material so that it protrudes beyond a second major surface of the first perforated material.

In some embodiments of the method, the flexible graphite material is a flexible graphite sheet material having first and second major surfaces, and the method further comprises embedding a second perforated material having at least one aperture in a second major surface of the flexible graphite sheet material, so that a first major surface of the second perforated material is in contact with the second major surface of the flexible graphite sheet material and so that a second portion of the flexible graphite sheet occupies the at least one aperture in the second perforated material. Embedding the second perforated material in the second major surface of the flexible graphite sheet material re-orients graphite flakes within the at least one aperture of the second perforated material to be out-of-plane. In some embodiments of the method, a significant portion are re-oriented to a substantially through-plane direction.

The methods described above can further comprise forming the composite material into a non-planar shape.

In any of the above-described composite materials and articles, and the above-described methods for making composite materials and articles the perforated material can be, for example, a metal, and adhesive film, or a plastic.at least one aperture is a plurality of apertures. The at least one aperture can be a plurality of apertures.

These and other aspects and embodiments of the invention are described in further detail below.

BRIEF DESCRIPTION OF DRAWINGS

FIG. 16E is a schematic cross-sectional diagram of another example of a composite material comprising a perforated material embedded in a major surface of a graphite sheet material, to increase the through-plane thermal conductivity of the graphite sheet material.

FIG. 16F is a schematic cross-sectional diagram of another example of a composite material comprising perforated materials embedded in both major surfaces of a graphite sheet material, to increase the through-plane thermal conductivity of the graphite sheet material.

DETAILED DESCRIPTION OF PREFERRED EMBODIMENT(S)

Processing of Flexible Graphite to Increase Through-Plane Thermal Conductivity

Flexible graphite, and other materials or devices prepared by compressing exfoliated graphite particles, tend to have highly anisotropic structures because of the preferential "in-plane" orientation of the graphite flakes perpendicular to the direction of compression. The bonding between flakes in the in-plane direction is governed by different physical forces than the bonding in the orthogonal through-plane direction (parallel to the direction of compression). The properties of such materials, such as thermal and electrical conductivity, therefore tend to be highly directional or anisotropic. Generally the in-plane thermal and electrical conductivity of these materials is many times greater than the through-plane thermal and electrical conductivity.

For some applications this anisotropy or directionality of properties is beneficial. For example, for heat spreaders, sheet materials with high in-plane thermal conductivity more efficiently spread heat laterally.

For other applications, the anisotropy of materials made by compressing exfoliated graphite can be reduced, and the ratio of their through-plane to in-plane thermal (or electrical) conductivity can be increased. For example, for some applications, the thermal conductivity in the through-plane direction can be increased. In some applications, it is desirable to have localized anisotropy in materials made by compressing exfoliated graphite, for example, in some regions having greater through-plane thermal conductivity than in other regions, and in some regions having greater in-plane thermal conductivity than in other regions.

Apparatuses and methods for reducing or modifying the anisotropy of materials made by compressing exfoliated graphite, through manipulation of the orientation or directional alignment of graphite flakes in the materials, are discussed below.

In one approach, the through-plane thermal conductivity of materials made by compressing exfoliated graphite can be increased by reducing the size of the graphite particles or flakes and/or by randomizing their orientation prior to compression. By reducing the size of the graphite particles or flakes and/or randomizing their orientation prior to compression, a more isotropic material with a lower ratio of in-plane to through-plane thermal conductivity can be obtained. Using this approach, materials with a through-plane conductivities of 20 W/mK to 30 W/mK and higher have been obtained.

Figure 1:
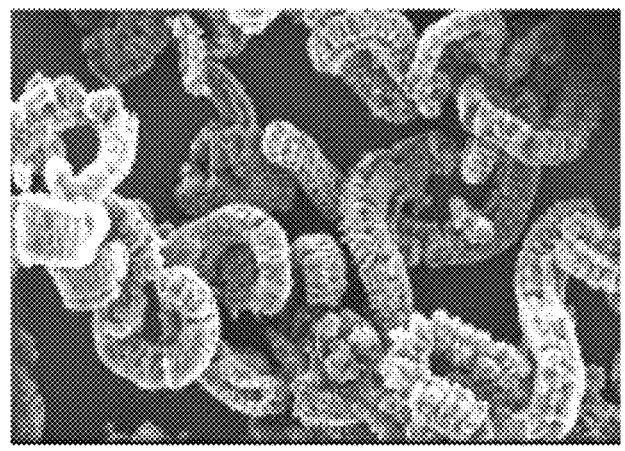
FIG. 1 (Prior art) is a scanning electron microscope image illustrating the structure of an exfoliated graphite sample.
Figure 2A:
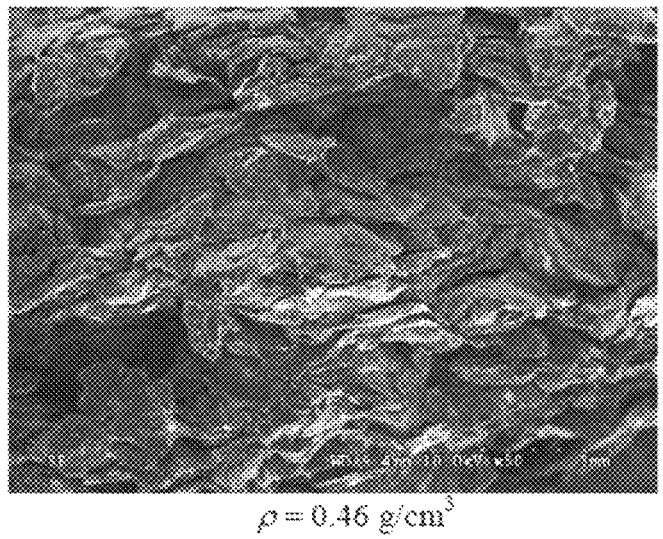
FIGS. 2A and 2B (Prior art) are scanning electron microscope images illustrating exfoliated graphite sheet material (flexible graphite) of a lower density structure and a higher density, respectively.
Figure 2B:
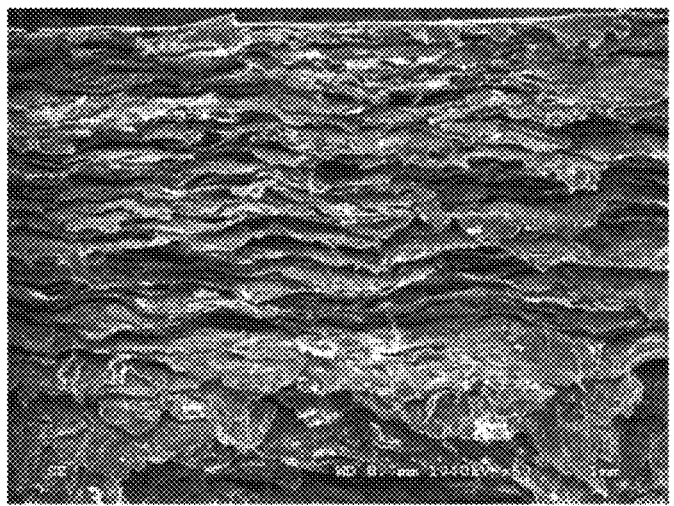
Figure 3:
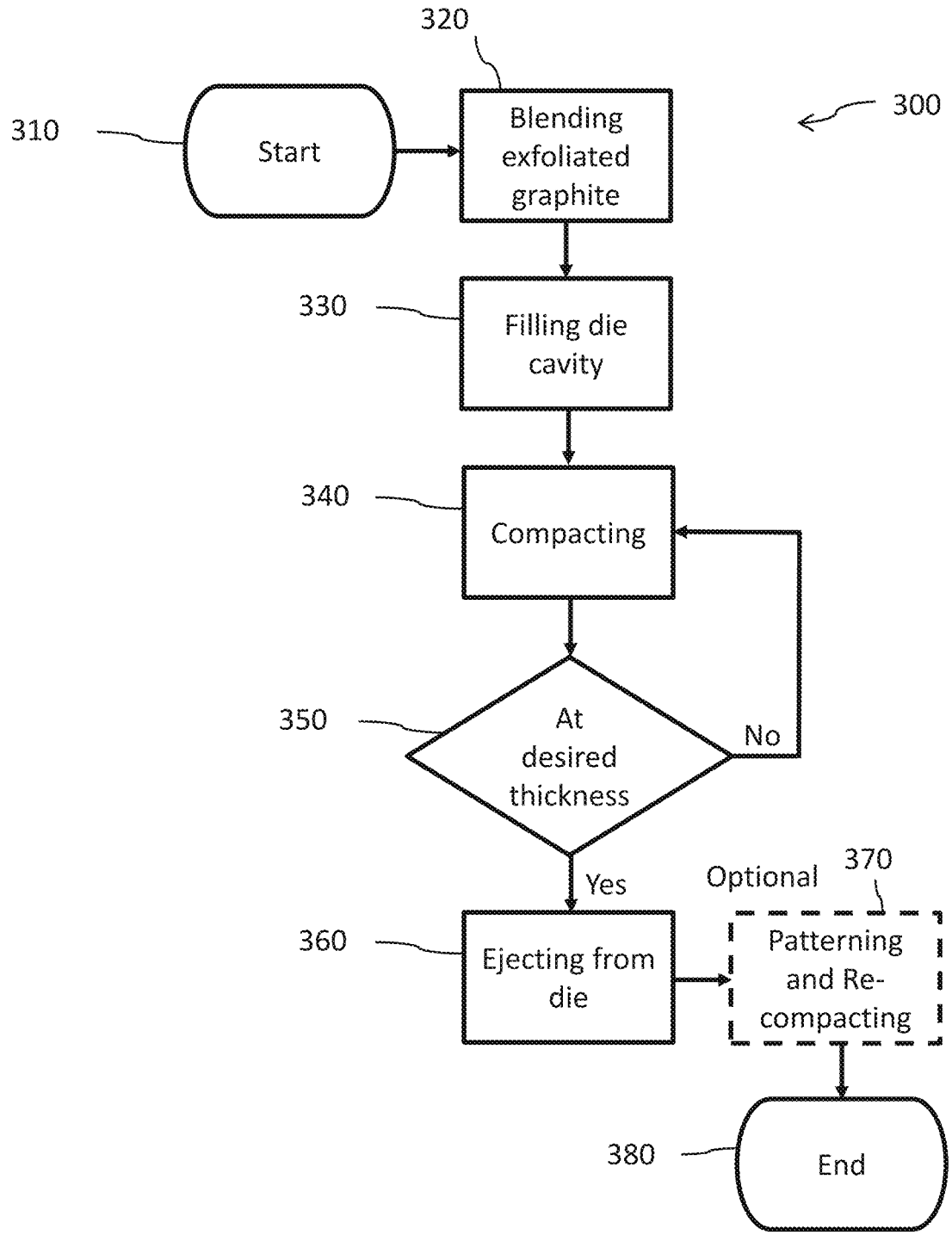
FIG. 3 is a flow chart showing a method for increasing through-plane thermal conductivity of flexible graphite.

FIG. 3 is a flow chart showing an embodiment of method 300 for increasing through-plane thermal conductivity of flexible graphite. Method 300 starts at step 310. At step 320, exfoliated graphite is blended, for example using an industrial blender. In this context, blending refers to chopping up the exfoliated graphite worms into smaller particles. At step 330, a suitable quantity of blended graphite (in powder form after blending) is transferred to a cavity in a die press assembly. At step 340, the blended graphite in the die press assembly is compacted using one or more punches. At step 350, the thickness is tested to determine whether the desired thickness of graphite has been achieved. If not, method 300 returns to step 340. When the desired thickness is reached, method 300 proceeds to step 360 and the compacted graphite material can be ejected from the die.

At step 370, the compacted graphite is optionally patterned on one or both sides. Patterning can be used to increase the orientation of the graphite flakes perpendicular to the plane of the material resulting in a material that has an even higher through-plane thermal conductivity. Patterning can be accomplished by replacing a smooth insert at the base of the die cavity by a patterned insert and/or using a patterned die. Suitable inserts can, for example, have patterns similar to those on patterned dies illustrated in FIGS. 4A through 4C. With the patterned insert and/or die in place, the graphite is re-compacted. Step 370 is optional and method 300 can proceed directly from step 360 when the desired thickness is reached to step 380. In some embodiments the patterned material from step 370 is compressed again using a smooth insert so that the surface(s) are flat or at least essentially flat, but the material retains some increased orientation of graphite flakes perpendicular to the plane of the material as a result of the patterning. Method 300 ends at step 380. In some embodiments, the resulting flexible graphite material can be produced in 100-200 micron sheets or pieces.

Figure 4A:
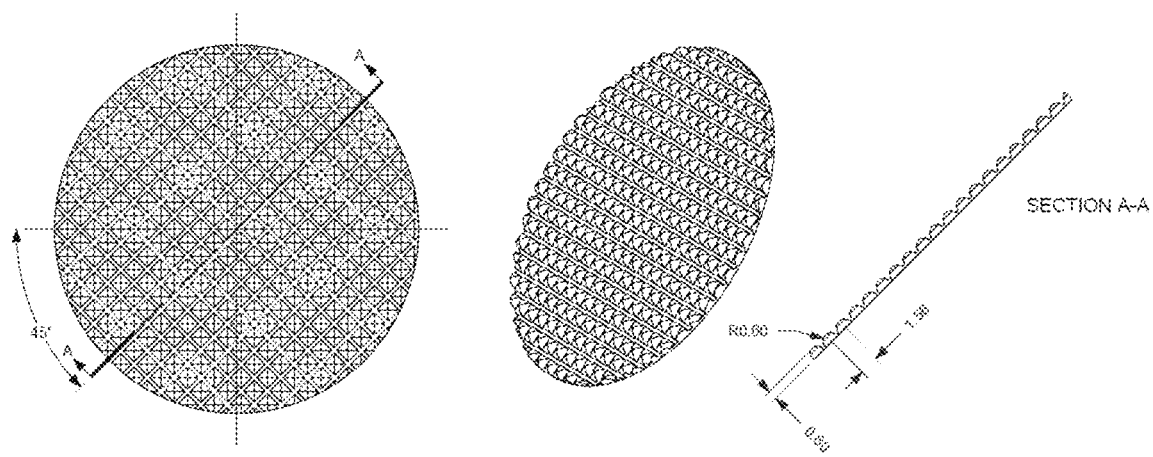
FIGS. 4A, 4B and 4C are engineering drawings of dies that can be used to pattern flexible graphite
Figure 4B:
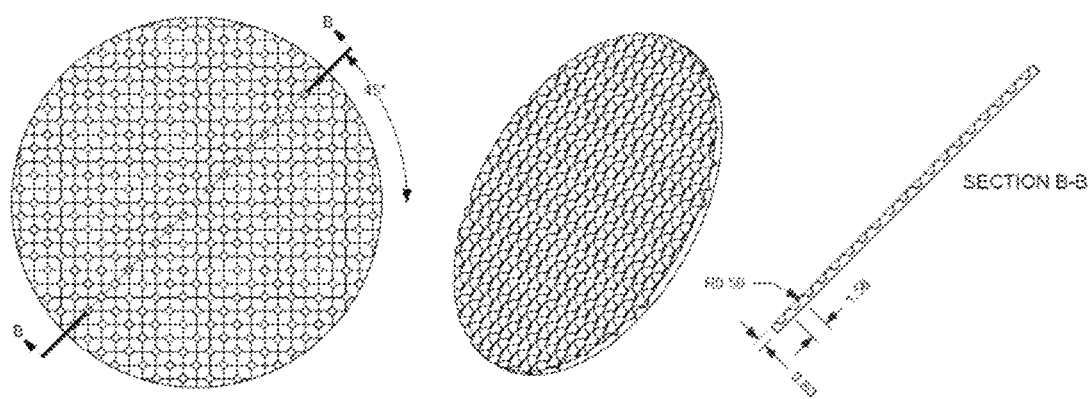
Figure 4C:
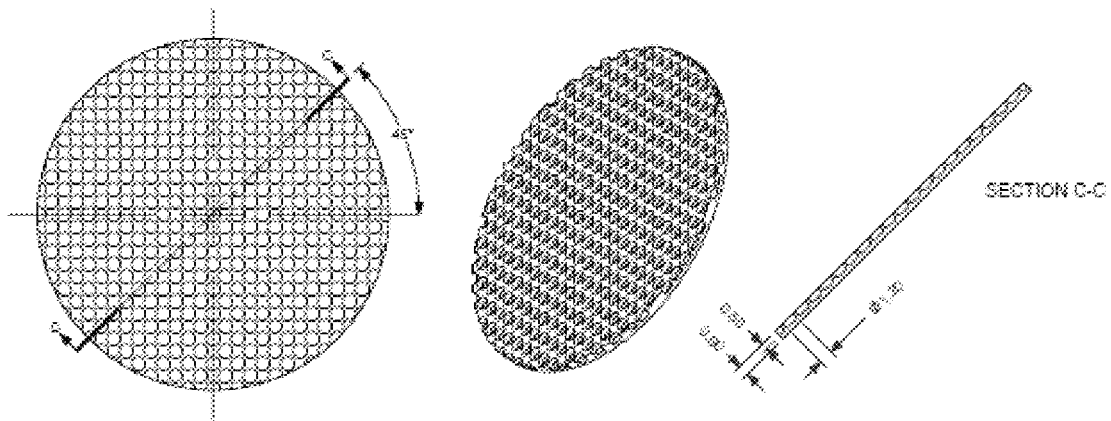

FIGS. 4A-C are engineering drawings of dies that can be used to pattern flexible graphite. FIG. 4A shows a die with a cross-hatched diamond pattern of grooves. FIG. 4B shows a die with a cross-hatched square pattern of grooves. FIG. 4C shows a die with an array of circular depressions which can be used to form an array of protruding "buttons" on the surface of a graphite sheet material. In some embodiments, the buttons are about 0.8-1.1 mm in diameter with a depth of about 0.4-0.5 mm, and a spacing of 0.5-1.5 mm. In some embodiments, the buttons are smaller than 0.8 mm in diameter and are more closely spaced together.

Figure 5A:
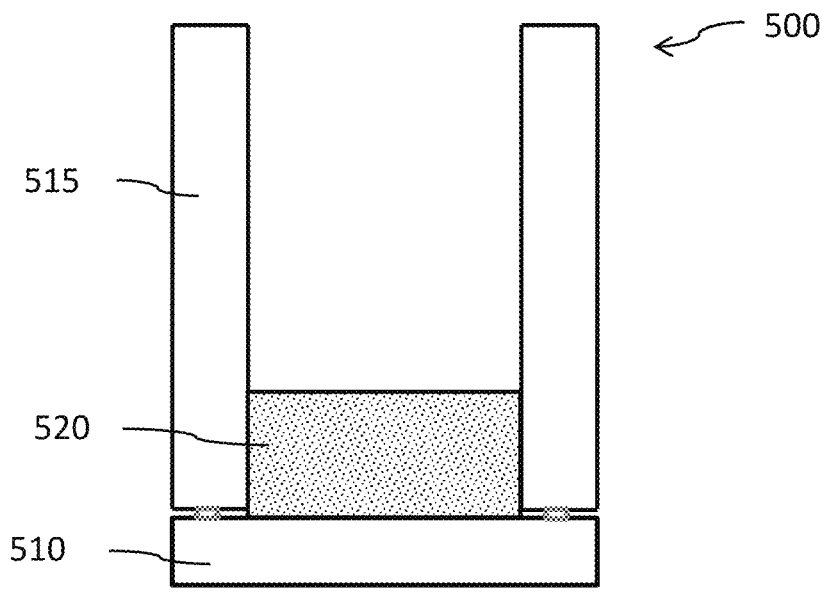
FIGS. 5A and 5B are cross-sectional diagrams showing a die fixture apparatus for compaction of exfoliated graphite.
Figure 5B:
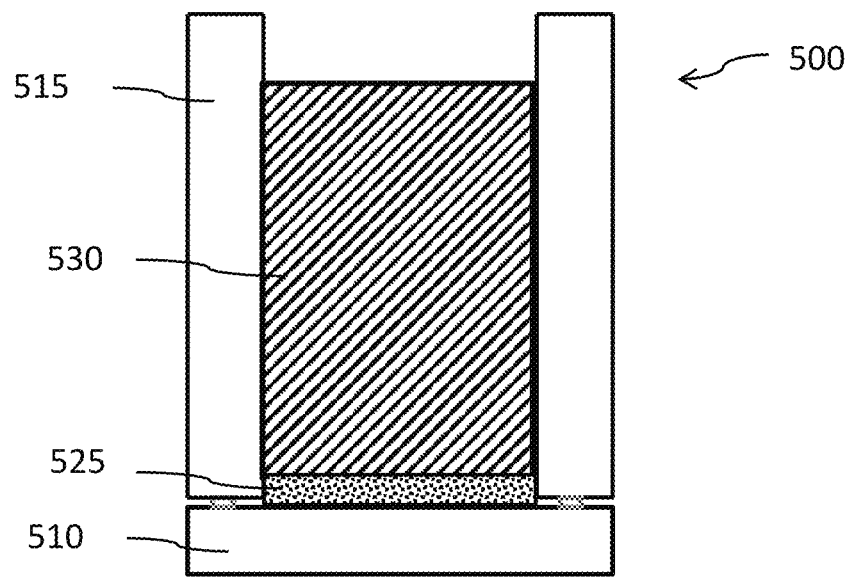

FIGS. 5A and 5B are schematic cross-sectional diagrams showing die fixture apparatus 500 for compaction of exfoliated graphite. Apparatus 500 comprises base plate 510, die cylinder 515 and punch 530 (shown in FIG. 5B). Punch 530 can also be referred to as a press or ram. Punch can be patterned or can be smooth (as shown). In some embodiments, a screen can be used as described below. Similarly base plate 510 can be flat or can be fitted with a patterned insert (not shown) to allow the material to be patterned on both sides. Die cylinder 515 is spaced slightly from base plate 510 to allow air to escape during compression. Blended exfoliated graphite material 525 is placed in the die cavity. Punch 530 of FIG. 5B is used to compact material 520 of FIG. 5A to produce compacted material 525 of FIG. 5B.

Figure 6A:
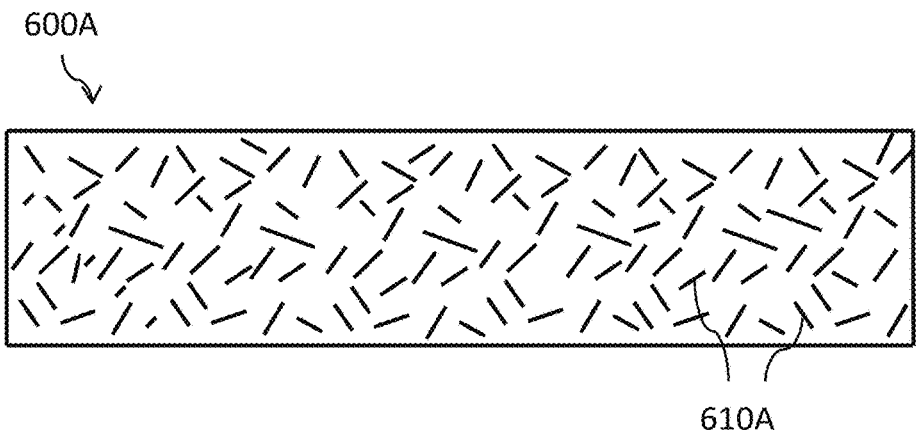
FIGS. 6A, 6B and 6C are schematic cross-sectional diagrams of flexible graphite materials produced by the method of FIG. 3.
Figure 6B:
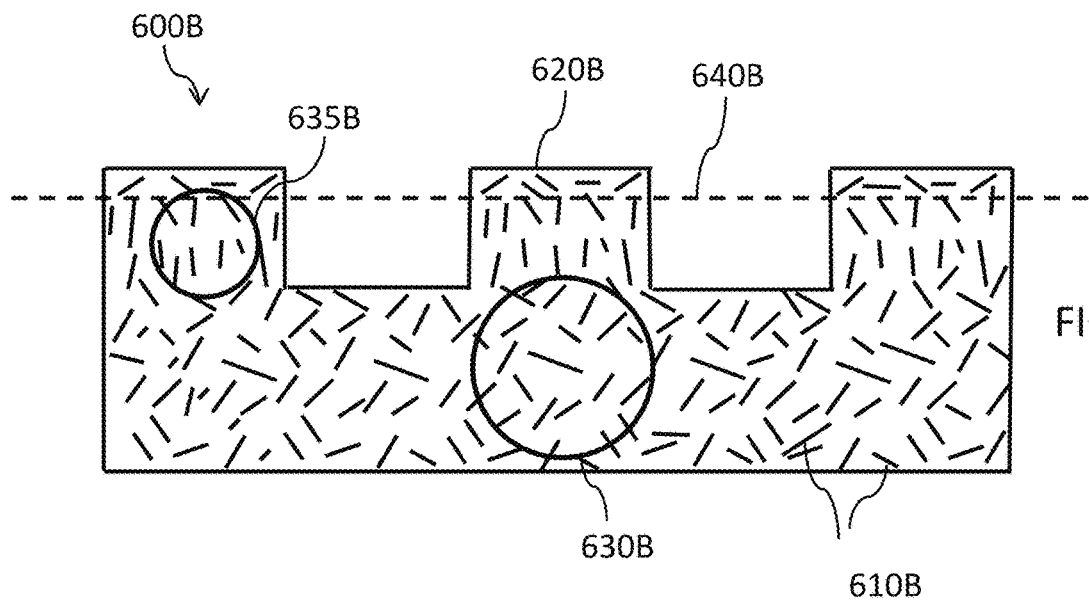
Figure 6C:
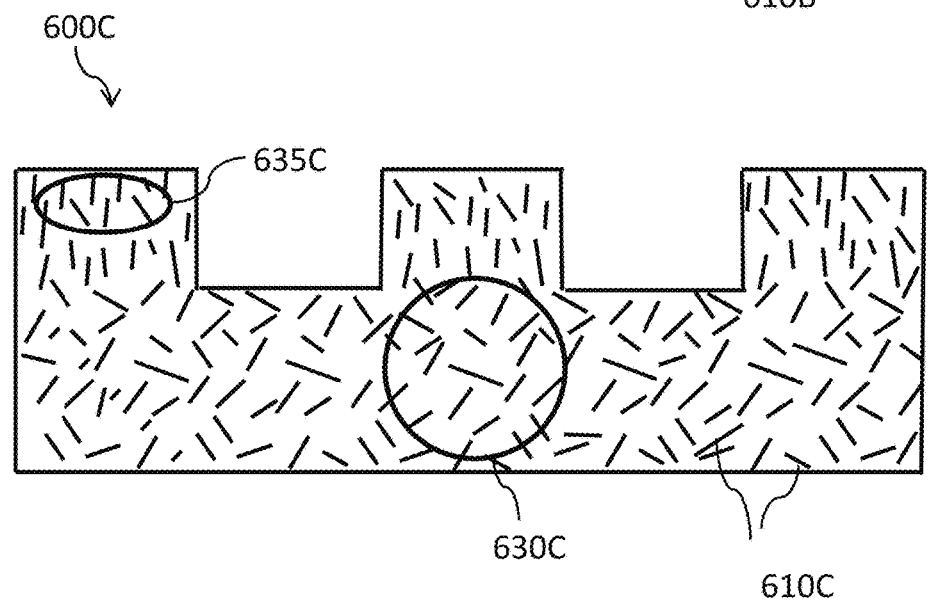

FIGS. 6A, 6B and 6C are schematic diagrams of flexible graphite materials produced by method 300 of FIG. 3. Flexible graphite materials 600A-C are shown schematically in cross-section and each comprise a plurality of graphite flakes 610A, 610B, and 610C, respectively.

Material 600A has been compacted by method 300 of FIG. 3 using a smooth punch and base plate. Graphite flakes 610A in material 600A are oriented in a random fashion, or at least with less in-plane orientation of graphite flakes than would be produced by a conventional roller or die compression process using exfoliated graphite material that has not first been blended (chopped up). For some thermal management applications, the thickness of the material illustrated in FIG. 6A is in the range of 60 μm to 350 μm. For this type of material, through-plane conductivities of about 20 W/mK to 30 W/mK have been obtained with thicknesses in the range of 220 to 350 μm. Thinner materials have lower thermal resistance.

Material 600B illustrated in FIG. 6B has been compacted by method 300 of FIG. 3 using a patterned punch or die. The upper surface of material 600B has castellated cross-section 620B. Graphite flakes 610B in the lower region of material 600B, such as in circle 630B for example, are oriented in a random fashion or at least with less in-plane orientation of graphite flakes than would be produced by a conventional roller or die compression process using exfoliated graphite material that has not first been blended (chopped up).

Graphite flakes in the upper region of material 600B, such as in circle 635B for example, are oriented in, or at least essentially in, a through-plane, direction (perpendicular to the direction of compression) or at least with a majority of the graphite flakes oriented in a direction that is generally perpendicular to the plane of the compressed material.

In material 600B of FIG. 6B there is less through-plane orientation of flakes at the top of each castellated region.

Material 600B can be post-processed by removing the uppermost layer as indicated by line 640B. This exposes graphite flakes that are oriented perpendicular, or at least essentially perpendicular, to the plane of the material. Removal can be accomplished by polishing, shaving, milling, scraping or other suitable methods.

FIG. 6C shows similar material 600C where flakes are oriented in a perpendicular/through-plane direction (or at least with a majority of the graphite flakes oriented perpendicular to the plane of the material) at the top of each castellated region such as in region 635C. Material 600C has exposed graphite flakes oriented in, or at least essentially in, a perpendicular/through-plane direction. Graphite flakes 610C in the lower region of material 600C, such as in circle 630C for example, are oriented in, or at least essentially in, a random fashion or at least with less in-plane orientation of graphite flakes than would be produced by a conventional roller or die compression process using exfoliated graphite material that has not first been blended (chopped up).

For some thermal management applications, the thickness of the materials illustrated in FIGS. 6A and 6B is greater than 100 µm, and can be in the range of 220 µm to 350 µm. Again thinner materials have lower thermal resistance, but it can be challenging to pattern very thin materials with surface features.

In another approach, the through-plane to in-plane thermal conductivity ratio of a conventional highly anisotropic graphite sheet material (for example, flexible graphite produced by calendering exfoliated graphite) can be increased by patterning the graphite sheet material. By further compressing the material with a patterned die or roller the orientation of the graphite flakes can be altered so that a significant portion of the flakes (at least near the patterned surface of the material) are oriented perpendicular to the plane of the material. The flakes tend to get pushed or moved into the grooves or cavities during the compression process.

The material can be patterned, for example, with a set of parallel channels and corresponding ribs between the channels. In some embodiments configured to increase the through-plane thermal conductivity, flexible graphite is patterned with an array of small protrusions, such as diamonds, squares or circular buttons or dots. In some embodiments, the sides of the channels or protrusions are perpendicular to the plane of the material (parallel to the direction of compression)—in other words the features on the patterned die press, roller or screen that is used to pattern the material have "vertical" side walls.

Figure 7A:
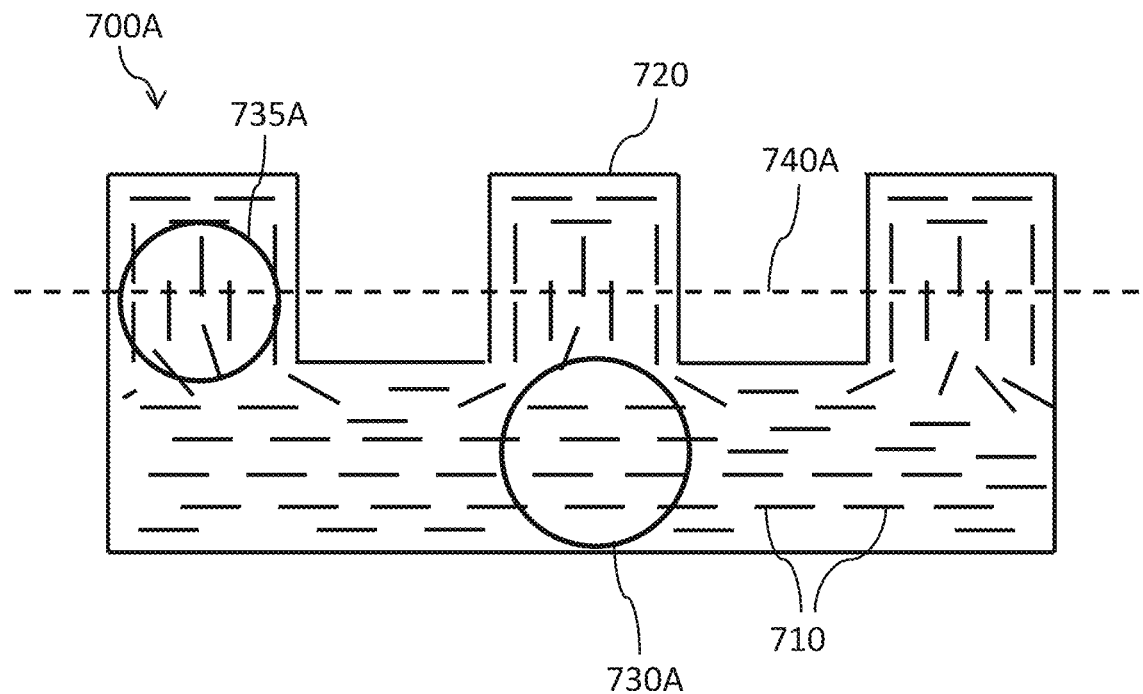
FIGS. 7A and 7B are schematic cross-sectional diagrams of patterned flexible graphite.
Figure 7B:
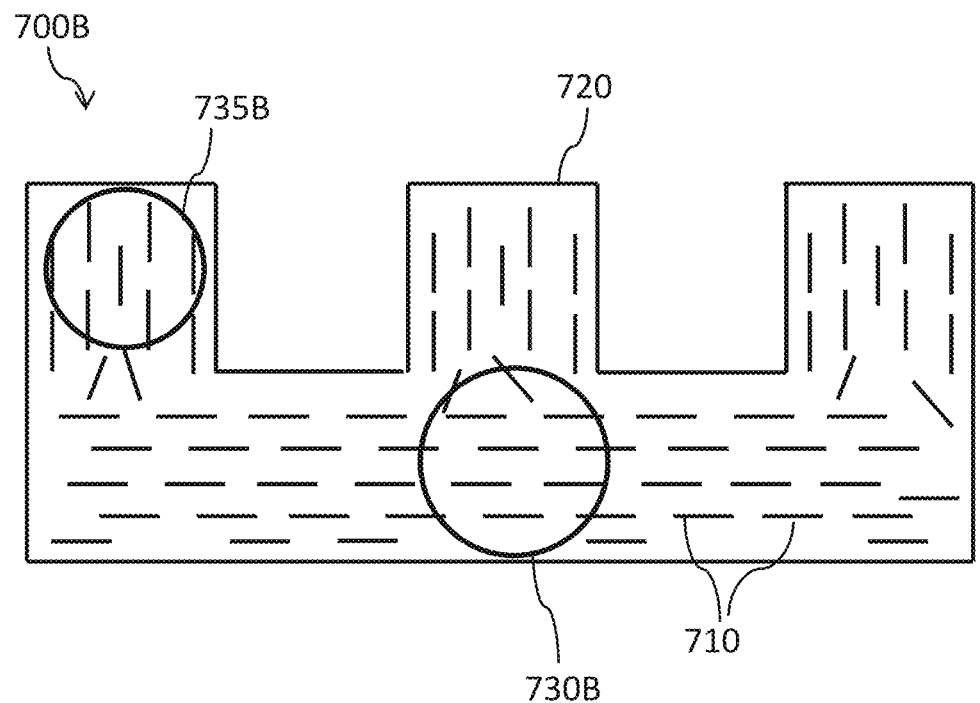

FIGS. 7A and 7B are schematic diagrams of flexible graphite materials 700A and 700B produced by patterning conventional highly anisotropic graphite sheet material in a manner which alters the orientation of a significant portion of the flakes (at least near the patterned surface of the material) so that they are oriented perpendicular to the plane of the material. Flexible graphite material 700A and 700B are shown in cross-section and comprises a plurality of graphite flakes such as graphite flakes 710.

Materials 700A and 700B have been patterned using a roller, die press, or other method. The upper surface of materials 700A and 700B has patterned cross-section 720 comprising a plurality of ribs and/or discrete protrusions.

Graphite flakes in the lower region of materials 700A and 700B, such as in circles 730A and 730B for example, oriented predominantly in-plane. Graphite flakes in the upper region of material 700A, such as in circle 735A for example, are oriented in, or at least essentially in, a perpendicular or through-plane direction or at least with a majority of the graphite flakes oriented generally perpendicular to the plane of the material.

In material 700A there is less "vertical" orientation of flakes at the top of the patterned surface. Material 700A can be post-processed by removing the uppermost layer as indicated by line 740A. This exposes graphite flakes that are oriented perpendicular to, or at least essentially perpendicular to, the plane of the material. Removal can be accomplished by polishing, shaving, milling, scraping or other suitable method.

In material 700B flakes are oriented in, or at least essentially in, a perpendicular or through-plane direction (or at least with a majority of the graphite flakes oriented generally perpendicular to the plane of the material) at the top of the patterned surface, such as in circle 735B. Material 700B has exposed graphite flakes oriented perpendicular to, or at least essentially perpendicular to, the plane of the material.

In some embodiments of a method for increasing the through-plane conductivity of a graphite sheet material, a perforated material or screen is used to pattern the graphite sheet material. The graphite sheet material is compressed against the screen and graphite flakes are squeezed into the apertures to form the pattern. This can offer advantages over a patterned die or roller where the "cavities" into which the graphite flakes are dead-ended or enclosed spaces (blind holes). The open apertures (through-holes) in the screen can allow even greater perpendicular orientation of the graphite flakes as they are not constrained by a cavity.

The term "perforated material" or screen as used herein, refers to a sheet material that has apertures or through-holes in it. The apertures or through-holes in the perforated material can be, but are not limited to, those made by physically perforating (punching or making holes in) a continuous sheet material.

Figure 8A:
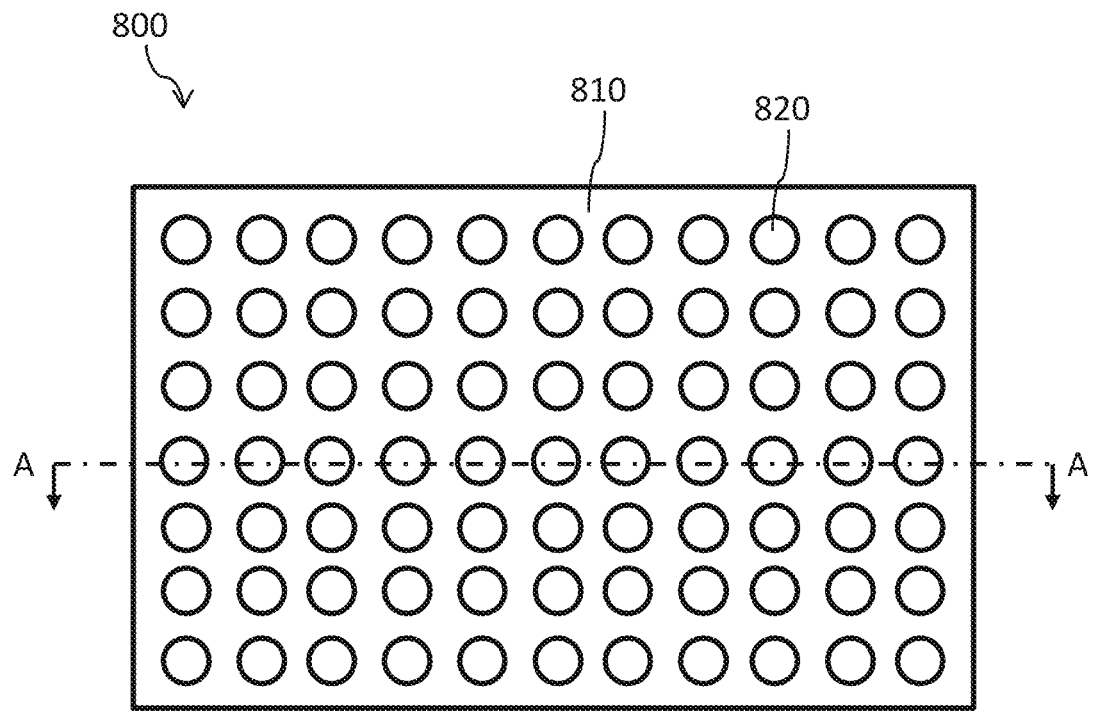
FIG. 8A is a plan view of a perforated screen that can be used to pattern flexible graphite.
Figure 8B:
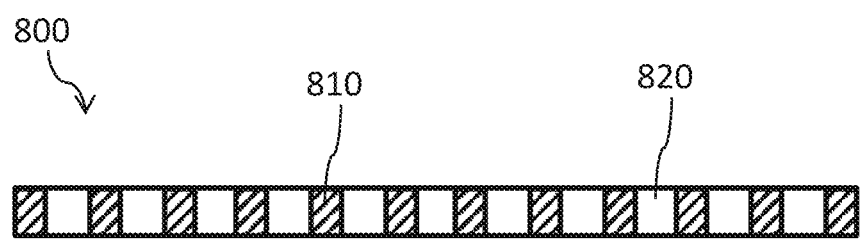
FIG. 8B is a cross-sectional view of the perforated screen (along line A-A of FIG. 8A).

FIG. 8A shows a plan view of perforated screen 800 that can be used to pattern flexible graphite with a pattern of protruding buttons. Screen 800 includes sheet material 810 and an array of circular apertures or through-holes 820. FIG. 8B shows a cross-sectional view of screen 800 (along line A-A of FIG. 8A). Screen 800 can be made from metal, plastic or another suitable material of a desired thickness. In some embodiments, the thickness of the screen is in the range of 120 µm to 500 µm. In some embodiments, the apertures are about 1 mm to 3 mm in diameter. In some embodiments, the apertures are less than 1 mm in diameter. In some embodiments, the apertures have diameters in the range of 100 µm to 400 µm. In some embodiments, the apertures are less than 100 µm in diameter.

Figure 9A:
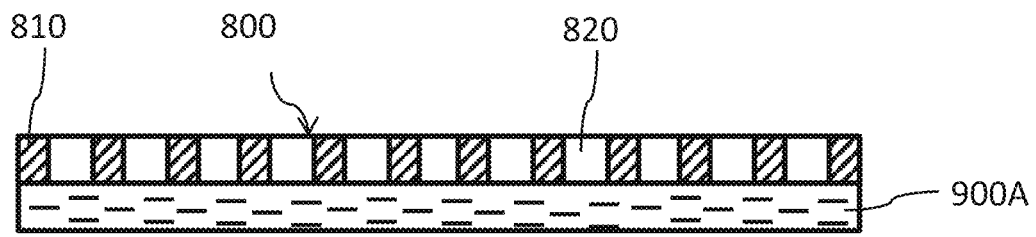
FIGS. 9A-D illustrate how a perforated screen can be used to pattern flexible graphite and increase its through-plane thermal conductivity.
Figure 9B:
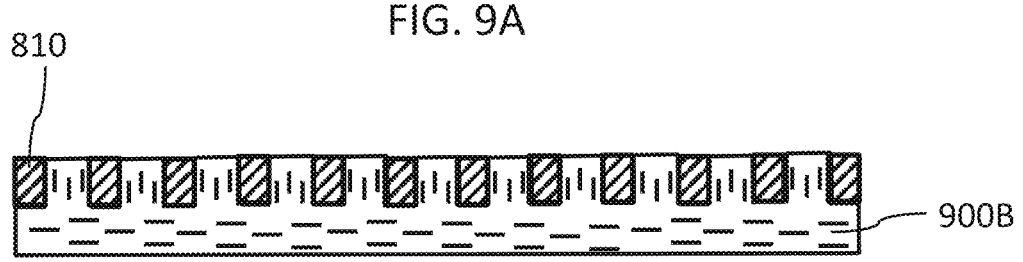
Figure 9C:

FIGS. 9A-D show how screen 800 of FIG. 8A can be used to pattern flexible graphite and increase its through-plane thermal conductivity. FIG. 9A shows screen 800 on top of a sheet of un-patterned anisotropic flexible graphite 900A. FIG. 9B shows screen 800 pressed down on and embedded in the flexible graphite so that graphite flakes are squeezed into perforations 820 to form a patterned graphite sheet material 900B. Flakes in the graphite material in and around the perforations tend to become oriented perpendicular to the plane of the material. FIG. 9C shows patterned graphite sheet material 900B with screen 800 removed.

Figure 9D:

Graphite sheet material that has been patterned to increase its through-plane conductivity can be used as-is or it can be further compressed, for example, using a smooth roller or die, so that the surface(s) are essentially flat and/or smooth. This approach causes the material to retain some increased perpendicular orientation of graphite flakes that resulted from the patterning. FIG. 9D is a schematic illustration showing graphite sheet material 900C obtained by further compressing patterned material 900B with a flat roller or die.

Using this approach of patterning and then flattening conventional graphite sheet materials, through-plane conductivities of about 15-18 W/mK have been obtained. This compares to typical through-plane conductivities of about 3-4 W/mK for conventional un-patterned graphite sheet material. In some embodiments, it is more convenient to take commercially available graphite sheet material and pattern it as described above, rather than using a blending and compression process as described, for example, in reference to FIG. 3. However, by blending graphite particles or flakes, forming a sheet material and then patterning, high through-plane conductivities, in some cases exceeding 40 W/mK, can be achieved. Another option is to compress exfoliated graphite worms directly with patterning to increase through-plane conductivity, without first blending to reduce the particle-size and without first forming an unpatterned flexible graphite sheet material.

Regardless of whether the exfoliated graphite material is patterned using a die, roller, screen or some other device, the shape, size and distribution of the surface features can be selected to suit the end-use application for the graphite, and to provide a material with desirable properties for that intended end-use application. For example, the graphite can be patterned with protrusions that are circular, rectangular, diamond-shaped, triangular or irregularly shaped. The material can be patterned with surface features of different shapes and/or sizes, and/or the surface features can be non-uniformly distributed across the material. The area of the surface features relative to the total area of the material can similarly be selected to suit the end-use application for the material, and to provide a material with desirable properties for that end-use application.

Figure 10A:
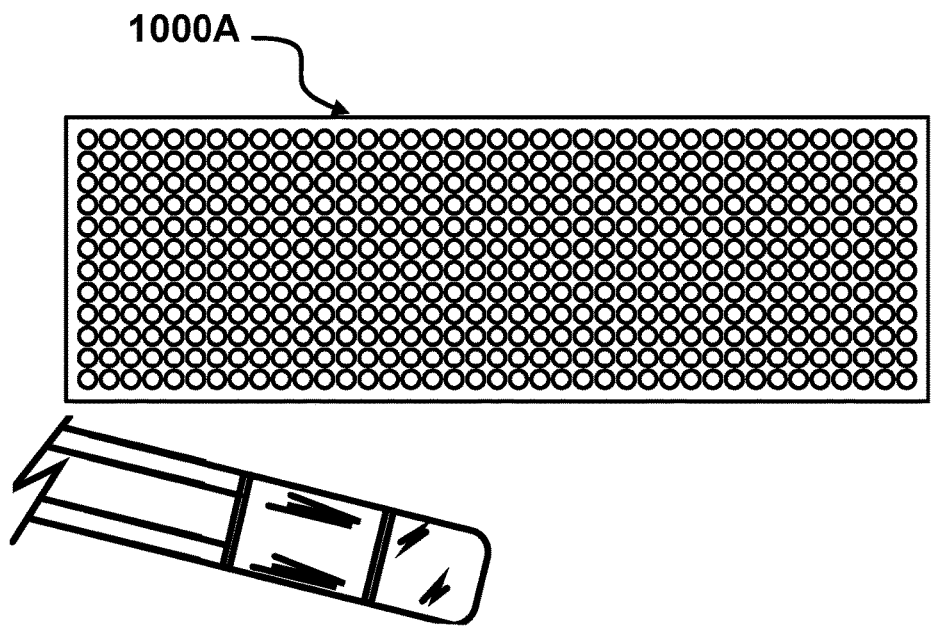
FIG. 10A illustrates a flexible graphite material patterned with an array of circular buttons.
Figure 10B:
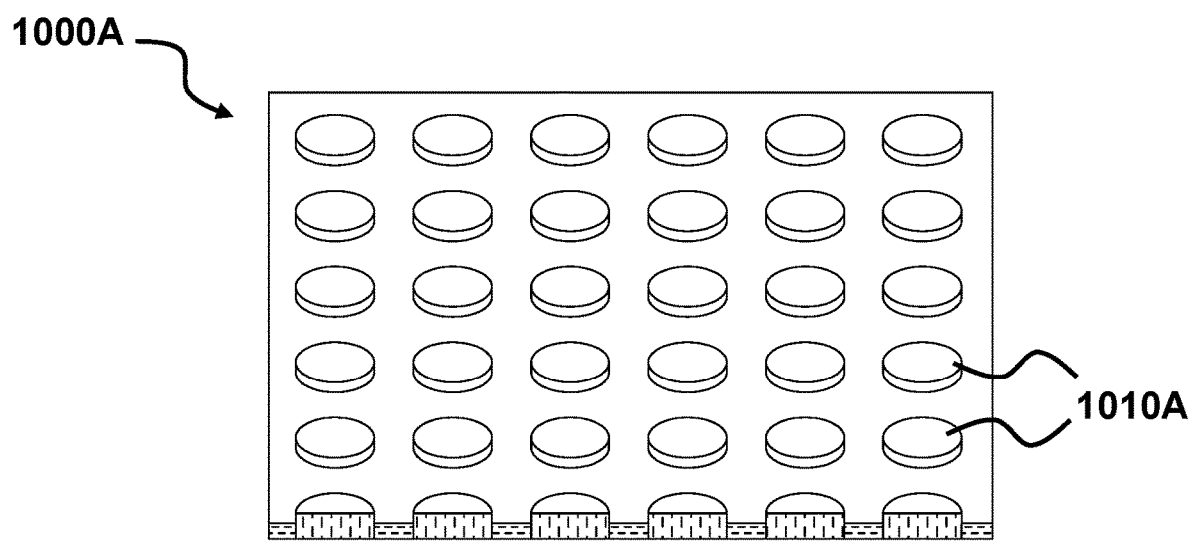
FIG. 10B is a close up view of the material shown in FIG. 10A.

FIG. 10A illustrates of graphite sheet material 1000A patterned with an array of circular buttons (pencil shown to give a sense of scale). This is an example of a material such as material 900B shown schematically in FIG. 9C. FIG. 10B is a close up view of material 1000A shown in FIG. 10A, clearly illustrating protruding buttons 1010A.

Figure 10C:
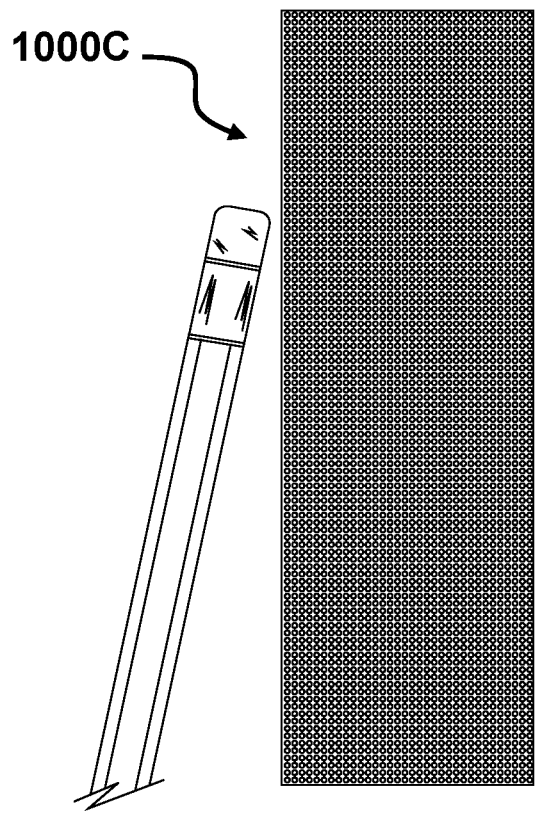
FIG. 10C illustrates a flexible graphite that has been patterned and then compressed with a flat die.
Figure 10D:
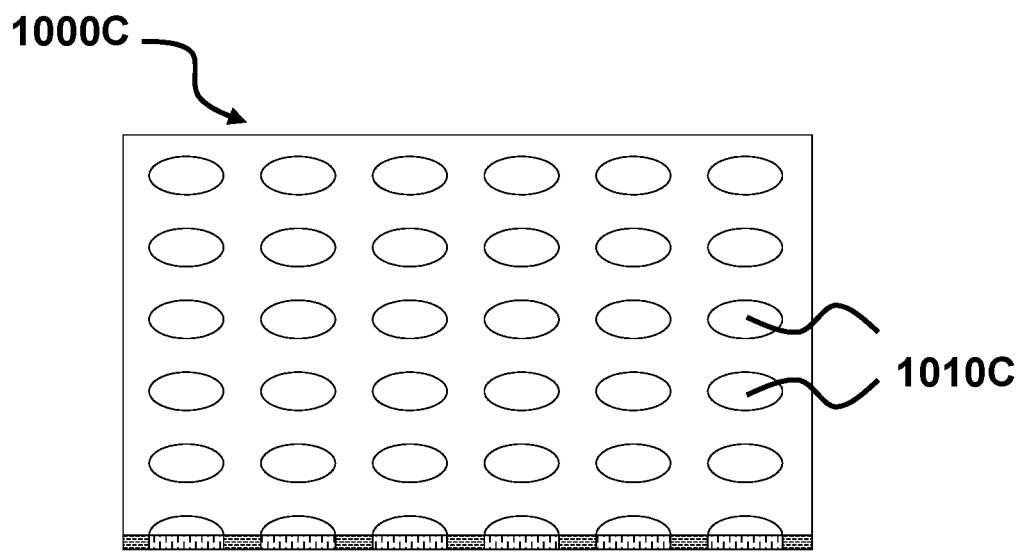
FIG. 10D is a close up view of the material shown in FIG. 10C.

FIG. 10C illustrates graphite sheet material 1000C (similar to material 1000A shown in FIG. 10A) but with the buttons compressed with a flat die—this is an example of a material such as material 900C shown schematically in FIG. 9D. FIG. 10D is a close up view of material 1000C shown in FIG. 10C; the outline 1010C of the flattened buttons can be seen.

Figure 11A:
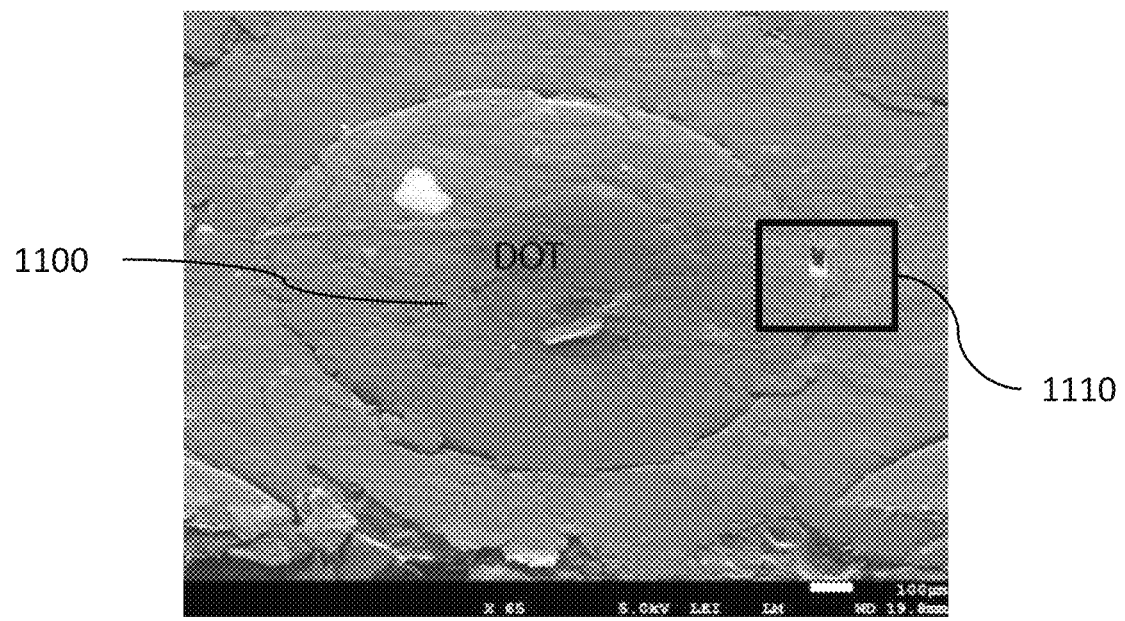
FIGS. 11A-C show scanning electron microscope images of a graphite sheet material that was patterned with a protruding button or dot pattern and was then compressed with a flat die.
Figure 11B:
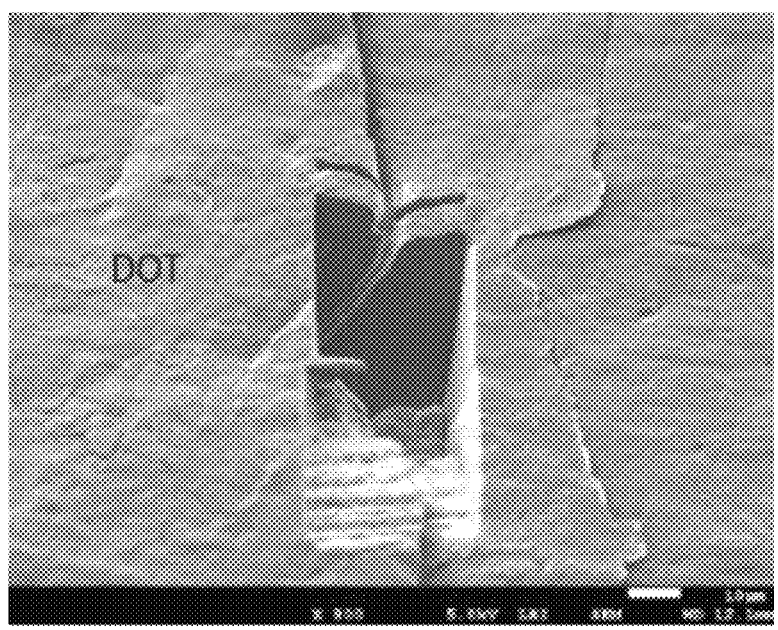
Figure 11C:
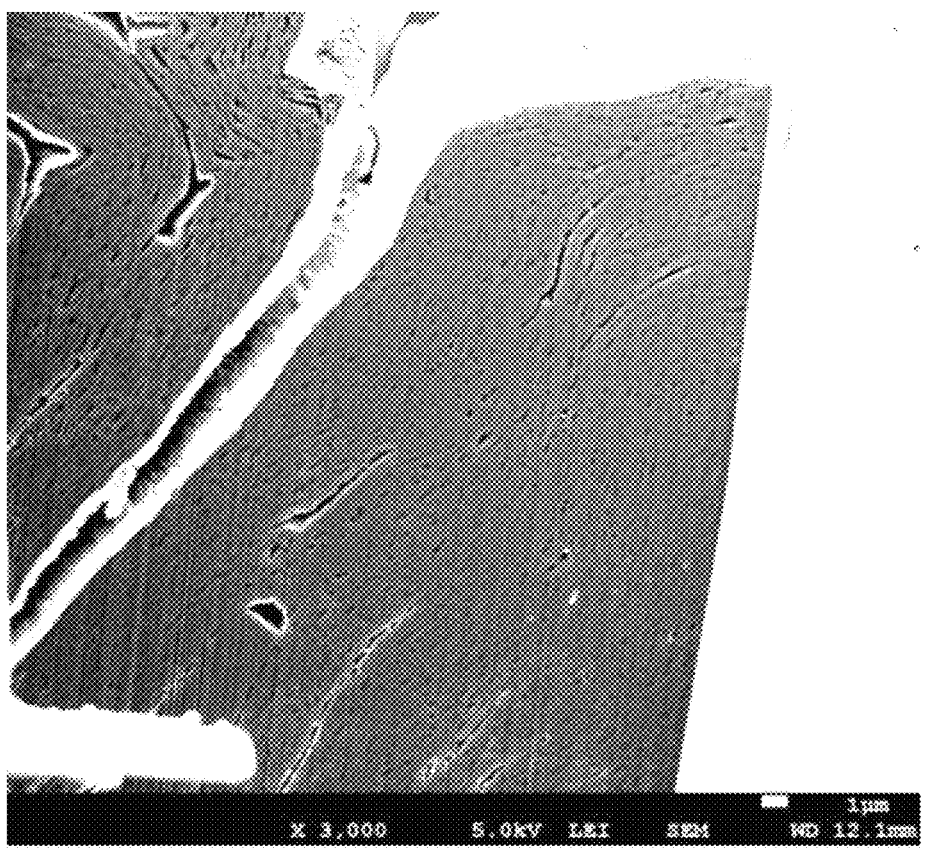

FIGS. 11A-C show scanning electron microscope images of a graphite sheet material that was patterned with a protruding button or dot pattern and was then compressed with a flat die. FIG. 11A shows button feature 1100 still visible at the surface after the material has been compressed with a flat die. Cross-section of portion 1110 straddling the button interface was prepared using a focussed ion beam. This sectioning technique caused little or no disruption to the graphite flakes in the sample. FIG. 11B shows a scanning electron microscope image of cross-section 1110. FIG. 11C shows a higher magnification image of a portion of cross-section 1110 shown in FIG. 11B. The orientation of the graphite flakes at the interface is clearly visible. FIG. 11C shows that the orientation of the flakes is almost perpendicular to the plane of the material, confirming that the patterning has resulted in increased orientation of the flakes perpendicular to the plane of the material.

Through-Plane Thermal Resistance

Thermal resistance is defined as the opposition a material presents to the flow of heat. The in-plane and through-plane thermal resistance can be indicative of the thermal anisotropy of flexible graphite.

Thermal properties of material can be measured with a variety of equipment. Common approaches for measuring thermal properties in the in-plane and through-plane directions include a laser flash method, a hot wire method, an ASTM D5470 method and combinations of the above methods. ASTM D5470 is a Standard Test Method for Thermal Transmission Properties of Thermally Conductive Electrical Insulation Materials and can be used to determine thermal resistance. The method involves placing the material to be tested between a hot surface and a cold surface, and measuring the heat flow.

Figure 12:
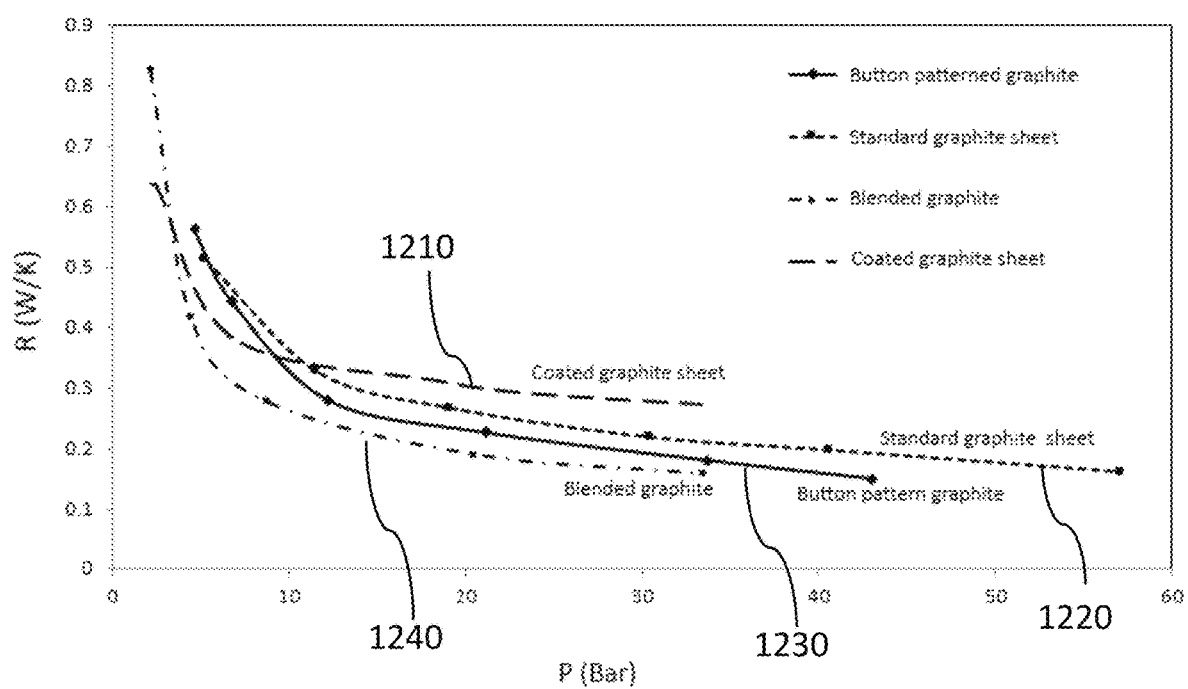
FIG. 12 is a graph showing measurements of through-plane thermal resistance for four samples of different graphite sheet materials.

FIG. 12 is a graph showing measurements of through-plane thermal resistance for four samples of different graphite sheet materials. Thermal resistance R is plotted as a function of pressure P for each of the materials as lines 1210 through 1240. Line 1210 labeled "coated graphite sheet" shows the behavior of the thermal resistance for a commercially available coated graphite sheet material with a sheet thickness of 0.017 mm and a density of 2.10 g/cm$^3$. Line 1220 labeled "standard graphite sheet" shows the behavior of the thermal resistance for a commercially available uncoated graphite sheet material with a sheet thickness of 0.48 mm and a density of 1.81 g/cm$^3$.

Line 1230 labeled "blended graphite" shows the behavior of thermal resistance for flexible graphite with a thickness of 0.42 mm and a density of 1.83 g/cm$^3$, produced according to method 300 of FIG. 3 without optional step 370. The graphite is blended and compacted to the desired thickness, and the orientation of the graphite flakes is largely random in the resulting flexible graphite sheet. In other words, the graphite flakes show no significant preference for either in-plane or through-plane orientation.

Line 1240 labeled "Button pattern graphite" shows the behavior of thermal resistance for flexible graphite with a thickness of 0.42 mm and a density of 1.9 g/cm$^3$, produced according to method 300 of FIG. 3 including step 370. Patterning was accomplished by positioning an insert at the base of the die cavity. In the case of line 1240 of FIG. 12, the insert was configured to achieve similar patterning on the graphite sheet as the button die shown in FIG. 4C, and the resulting material was similar to that illustrated in FIGS. 10C and 10D, for example. Graphite flakes in the resulting graphite sheet show greater through-plane orientation.

The thermal resistance line 1220 for the commercially available uncoated graphite sheet provides a baseline value. FIG. 12 shows that the systems and methods described herein can provide flexible graphite sheet material having lower through-plane thermal resistance than commercially available materials.

Thus, the systems and methods described above can be used to manipulate the orientation of graphite flakes to produce flexible graphite with greater through-plane thermal conductivity which can be beneficial in thermal management applications.

Thermal Interface Materials (TIMs) Comprising Exfoliated Graphite

Materials such those shown in FIG. 9D and FIG. 10C can be used as thermal interface materials. A thermal interface material (also known as a TIM) is a thermally conductive material that is commonly used to transfer heat from a heat source to a heat sink. Generally is it desirable that a TIM can transport high heat flux, and provide excellent contact between the surfaces, for example, so that it fills voids or irregularities between a heat source (or mount thereof) and a heat sink and/or between and heat spreader and a heat sink. Often pastes, greases and films are used as TIMS, but they generally have poor electrical conductivity, and often they deteriorate over time, for example, by hardening or seeping out of the interface between the two components.

Flexible graphite sheet materials produced by the system and methods described above can be used as TIMs. Such materials can provide through-plane thermal conductivity that is an order of magnitude greater than commonly used TIMs, and that is significantly (for example, 3-5 times) greater than conventional graphite sheet materials. An example of a suitable TIM material is made using the method described in reference to FIGS. 9A-D and is similar to the material illustrated in FIGS. 10C and 10D, with buttons (prior to compression) having a diameter in the range of 0.5 mm to 0.85 mm, a height of 0.25 mm to 0.80 mm, on a 1.4 mm pitch (grid). Some embodiments of the materials described have though-plane conductivities of greater than 20 W/mK. Some embodiments of the materials described have through-plane conductivities of greater than 25 W/mK. For some examples, though-plane conductivities of at least 30 W/mK have been achieved. Embodiments of the graphite sheet materials described herein can conform well to the surface(s) with which they are in contact. They can be clamped or otherwise fastened between a heat source and a heat sink. Graphite offers other advantages over conventional TIMs including reduced cost, low thermal expansion, being less susceptible to corrosion, hardening and material creep.

Figure 13A:
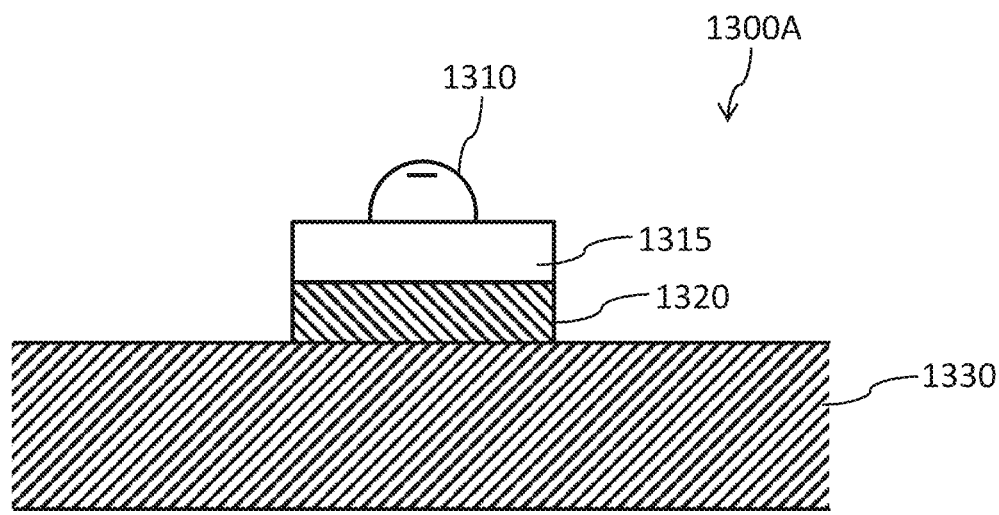
FIG. 13A (Prior art) is a schematic diagram showing a cross-section of an apparatus comprising a light-emitting diode (LED) and a conventional mechanism for heat removal.

FIG. 13A (Prior art) is a schematic diagram showing a cross-section of apparatus 1300A comprising light-emitting diode (LED) 1310, which generates heat when in use, and a conventional mechanism for heat removal. LED 1310 is mounted on substrate 1315. The conventional mechanism for heat removal includes thermal interface material (TIM) 1320 and copper heat spreader 1330. Heat is conducted away from LED 1310 through TIM 1320 to copper heat spreader 1330.

Figure 13B:
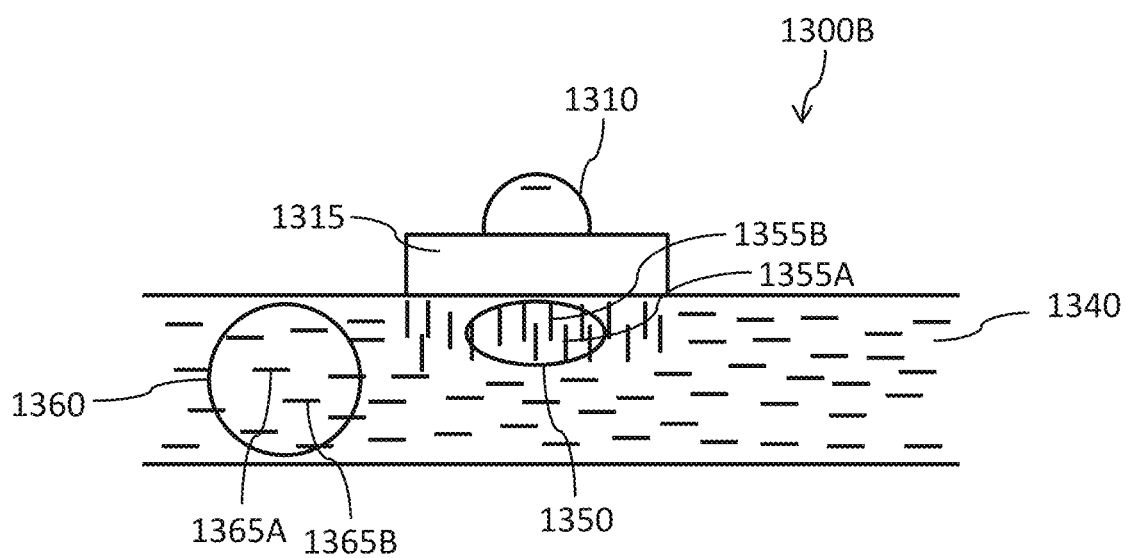
FIG. 13B is a schematic diagram showing a cross-section of an apparatus comprising a light-emitting diode (LED) and use of flexible graphite material for heat removal.

FIG. 13B is a schematic diagram showing a cross-section of apparatus 1300B comprising LED 1310 mounted on substrate 1315, and sheet of flexible graphite 1340. Flexible graphite sheet 1340 can be produced by the technology disclosed here, and includes two or more regions with different directional thermal properties. Region 1350, located under and adjacent to LED 1310 in the embodiment shown, has a significant portion of graphite flakes orientated perpendicular to the plane of the material, such as flakes 1355A and 1355B. Region 1350 can be patterned with protruding buttons and then compressed flat, for example. In the illustrated embodiment, region 1360 occupies the bulk of flexible graphite sheet 1340, surrounds one or more regions such as region 1350, and has graphite flakes predominantly in an in-plane orientation such as flakes 1365A and 1365B. In alternative embodiments, the bulk material including region 1360 comprises graphite flakes in, or at least essentially in, random orientation.

In one approach, flexible graphite sheet 1340 can be produced by placing a circular sheet of flexible graphite in a die cavity (such as cavity 515 of die 510 press assembly of FIG. 5A), inserting a button die (such as shown in FIG. 4C), the button die with a patterned region corresponding to region 1350 (having smaller diameter than the circular sheet of flexible graphite), and compressing or compacting the sheet. The process causes graphite to be pushed into "pockets" in the die, the pockets containing graphite flakes with more through-plane orientation. The sheet can be further compressed, using a smooth die, so that the top surface of the graphite is then flat, but with substantial through-plane flake orientation in region 1350. In other approaches, flexible graphite sheet 1340 can be produced by starting with flexible or exfoliated graphite that has been blended, for example using an industrial blender. In this context, blending refers to chopping up the exfoliated graphite into smaller particles. The blended graphite is placed in a die cavity and patterned and compressed as described above.

A benefit of the flexible graphite thermal interface material is that heat can be transported away from the LED heat source, first in the through-plane or vertical direction, and then in the in-plane or horizontal direction, via a single or unitary integrated component. This simplifies the thermal management hardware, and reduces the number of material interfaces. Interfaces where two materials are adjacent to one another, tend to impede heat transfer.

Integrated thermal interface materials produced by the methods described above, and comprising two or more regions of material with different thermal anisotropy, are suitable for a variety of applications including, but not limited to, heat removal from luminaires and power rectifiers.

Thermal Packaging Assemblies Comprising Exfoliated Graphite

Figure 14A:
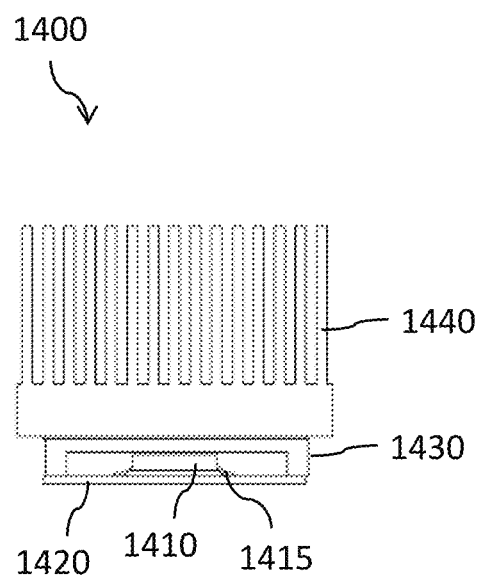
FIGS. 14A and 14B (Prior art) are a show a conventional packaging assembly for a flip chip.
Figure 14B:
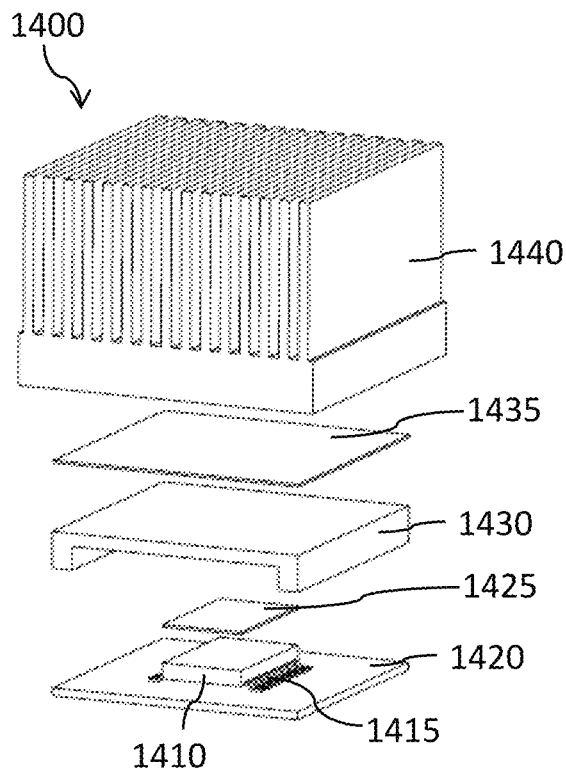

Thermal management of electronic components such as integrated circuits, chips, flip-chips and the like can be challenging, especially given that there are often weight and volume constraints on thermal packaging. The ability to dissipate heat effectively away from heat-generating components and out of the associated electronic packaging assembly is important. The ability of the assembly to dissipate heat is generally a function of the quality of the primary heat dissipation path from the heat-generating component to the external surface of the packaging assembly. FIGS. 14A and 14B (Prior art) show a typical, conventional packaging assembly 1400 for a flip chip. FIG. 14A is a cross-sectional view and FIG. 14B is an exploded view showing the various components. Chip 1410 is mounted to substrate 1420 via solder connections 1415. Lid or cap 1430 is positioned over chip 1410 and protects the chip, as well as providing a thermal pathway for heat dissipation. Heat sink 1440 is disposed on top of lid 1430. Thermal interface layer 1425 is interposed between lid 1430 and chip 1420, and thermal interface layer 1435 is interposed between lid 1430 and heat sink 1440. Heat sink 1440 is typically aluminum, and lid 1430 is typically an alloy such as Fernico I or nickel/iron. Thermal interface layers 1425 and 1435 are typically a thermally conductive paste. The components of assembly 1400 are clamped or secured in place by a suitable mechanism.

Conventional thermal interface layers 1425 and 1435 can be replaced with flexible graphite thermal interface materials modified to have increased through-plane conductivity as described above.

Figure 14C:
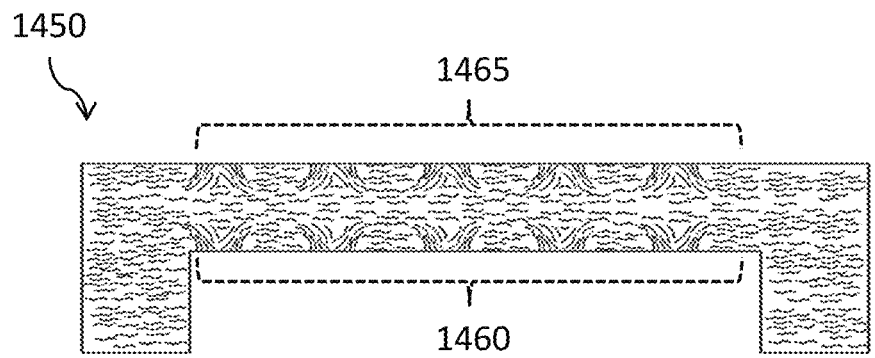
FIG. 14C is a schematic cross-sectional diagram of an integrated lid formed by patterning and compressing exfoliated graphite material.

The thermal performance of an electronics packaging assembly can be further improved by integrally forming the thermal interface layers with the lid as a single component, as shown in FIG. 14C. FIG. 14C is a schematic cross-sectional diagram of integrated lid 1450 formed by compressing exfoliated graphite material. Integrated lid 1450 can replace three components (1425, 1430 and 1435) in packaging assembly 1400 shown in FIGS. 14A and 14B, reducing the number of thermal interfaces and the thermal resistance of the heat dissipation path from chip 1410 to heat sink 1440. The orientation of the graphite flakes in lower and upper thermal interface regions 1460 and 1465 is modified by patterning during formation of integrated lid 1450 (as described above) so that the through-plane thermal conductivity in these regions is greater than in the rest of the lid. The orientation of individual graphite flakes in integrated lid 1450 is indicated by the wavy lines. These regions with greater through-plane orientation can provide an excellent thermal path from chip 1410 directly to integrated lid 1450, and then directly to heat sink 1440.

Figure 15A:
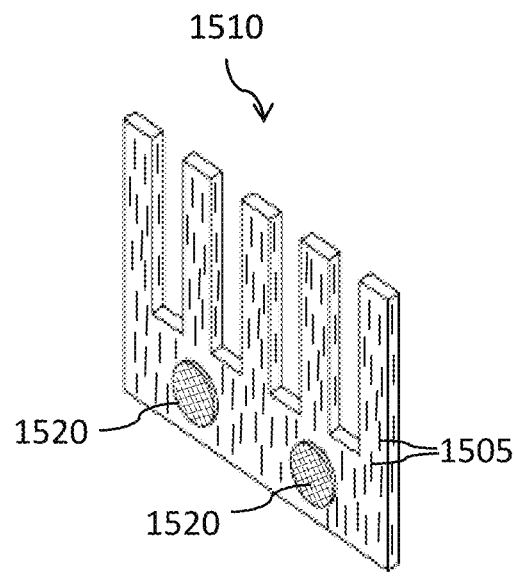
FIG. 15A shows a piece of flexible graphite cut to a desired shape and having patterned regions with higher through-plane thermal conductivity.
Figure 15B:
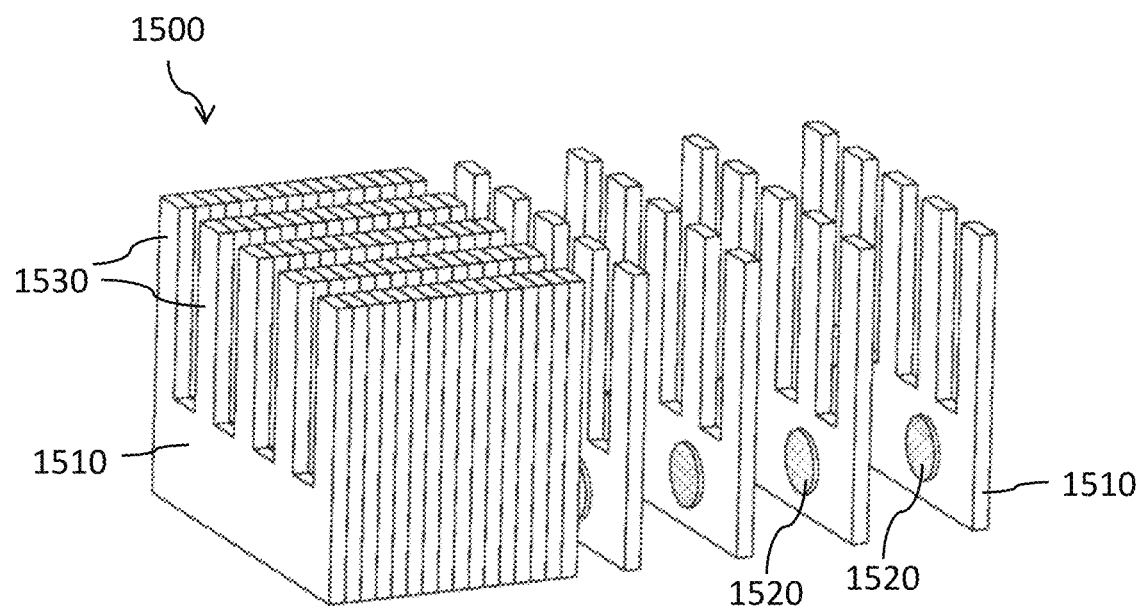
FIG. 15B is an exploded view of a heat sink made by laminating pieces of flexible graphite like that shown in FIG. 15A.

A heat sink can also be formed of laminated sheets of flexible graphite, as shown in FIGS. 15A and 15B. FIG. 15A shows a piece of flexible graphite 1510 cut to a desired shape. The graphite flakes 1505 in most of the material are oriented predominantly in-plane (parallel to the plane of the sheet material). Region 1520 is patterned and then optionally compressed (as described above) so that the through-plane thermal conductivity in this region is greater than in the rest of the piece (with flakes oriented perpendicular to flakes 1505). A plurality of pieces like 1510 can be laminated together (with or without the use of an adhesive), as shown in the exploded view of FIG. 15B to form heat sink 1500 with plurality of fins 1530. Regions 1520 facilitate through-plane heat transfer from one piece 1510 to adjacent pieces in the laminated structure, and can thereby improve heat distribution and heat dissipation from heat sink 1500. Heat sink 1500 can be mounted to integrated lid 1450 of FIG. 14C (or to a conventional lid). The in-plane orientation of the graphite flakes in most of heat sink 1500 provides a low thermal resistance path from lid 1450 to fins 1530.

As described above, a perforation material or screen can be used to manipulate the orientation of graphite flakes during compression of exfoliated graphite materials, to produce materials, or regions of material, with enhanced through-plane thermal conductivity which can be beneficial in thermal management applications. In the method described in reference to FIGS. 9A-C, once the screen has been used to re-orient graphite flakes in flexible graphite, the screen can be removed and the resulting patterned graphite sheet material can be used as-is or can be further processed.

In other embodiments, a screen or perforated material that is compressed against and embedded in an exfoliated graphite material and orients or re-orients graphite flakes in a through-plane direction (perpendicular to the direction of compression) can be left in place, to provide novel composite materials or devices.

Composite Materials Comprising Exfoliated Graphite

In some embodiments, a composite material comprises a perforated material embedded in one or both major surfaces of a graphite sheet material so that the perforations are occupied by graphite flakes, a significant portion of which are oriented out-of-plane relative to the plane of the composite material. In some embodiments, a significant portion of the flakes in the perforations are oriented perpendicular to the plane of the composite material. In some embodiments of a composite material, the perforated material is embedded in surface(s) of the graphite sheet material so that graphite is substantially flush with the exposed surface of the perforated material. In other embodiments of a composite material, the perforated material is embedded in the surface(s) of the graphite sheet material so that graphite extends through the perforations and protrudes above the exposed surface of the perforated material.

The term "perforated material" as used herein, refers to a sheet material that has apertures or through-holes in it. The apertures or through-holes in the perforated material can be made, but are not necessarily made, by physically perforating (punching or making holes in) a continuous sheet material. The material can be formed with apertures therein, for example: by molding a sheet material to have through-holes in it; by weaving, welding and/or tangling strands of material to form a mesh or grid; by slitting and stretching a sheet material to form an expanded material, etc.

Figure 16A:
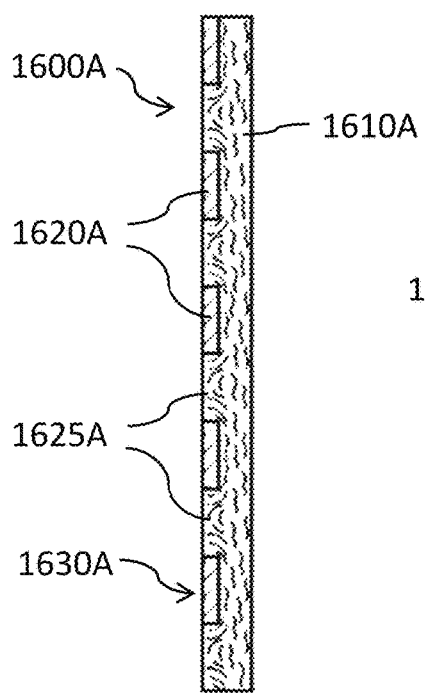
FIG. 16A is a schematic cross-sectional diagram of an example of a composite material comprising a perforated material embedded in a major surface of a graphite sheet material, to increase the through-plane thermal conductivity of the graphite sheet material.
Figure 16B:
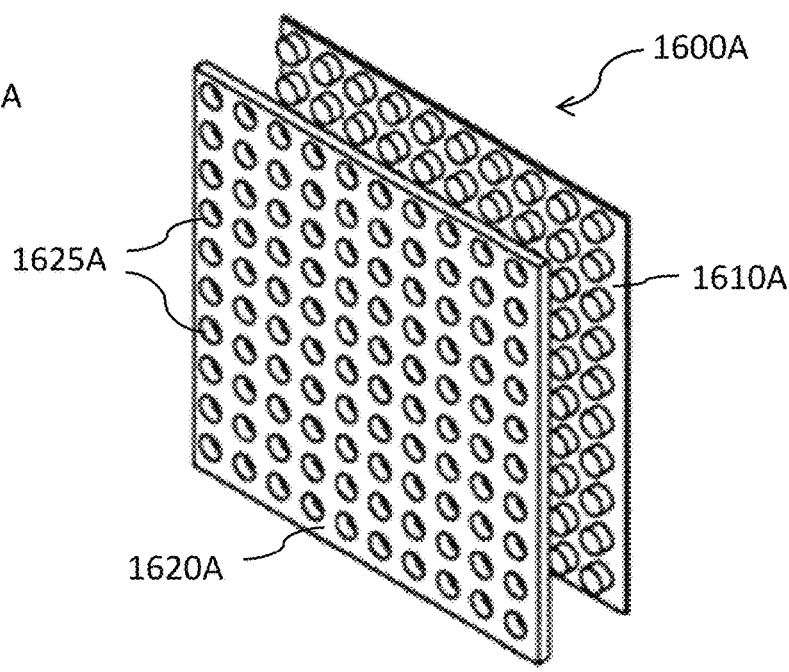
FIG. 16B is an exploded view of an example of a composite material similar to that illustrated in FIG. 16A.

FIG. 16A is a schematic cross-sectional diagram of composite material 1600A comprising perforated material 1620A embedded in a major surface of graphite sheet material 1610A, so that graphite occupies perforations 1625A and is substantially flush with exposed surface 1630A of perforated material 1620A. FIG. 16B is an exploded view of an example of a composite material like material 1600A, where perforations 1625A are circular and in a grid pattern.

Figure 16C:
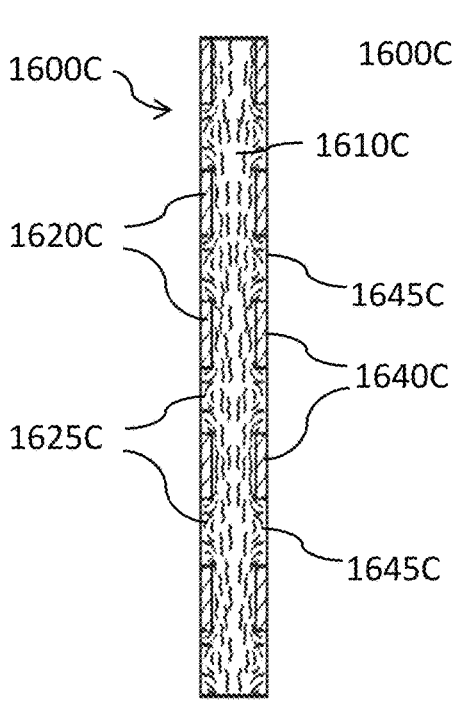
FIG. 16C is a schematic cross-sectional diagram of an example of a composite material comprising perforated materials embedded in both major surfaces of a graphite sheet material, to increase the through-plane thermal conductivity of the graphite sheet material.
Figure 16D:
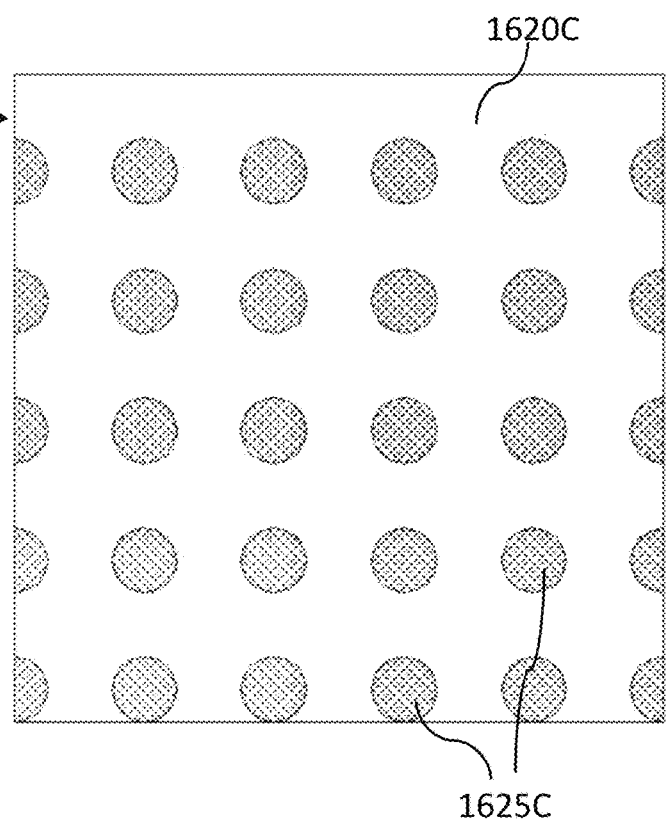
FIG. 16D is a plan view of the composite material illustrated in FIG. 16C.

FIG. 16C is a schematic cross-sectional diagram of composite material 1600C comprising perforated materials 1620C and 1640C embedded in the major surfaces of graphite sheet material 1610C, so that graphite occupies perforations 1625C and 1645C, and is substantially flush with the exposed surfaces of the respective perforated materials 1620C and 1640C. Perforated materials 1620C and 1640C can be the same or different from one another. FIG. 16D is a side view schematic diagram of composite material 1600C.

Figures 16E, 16F:
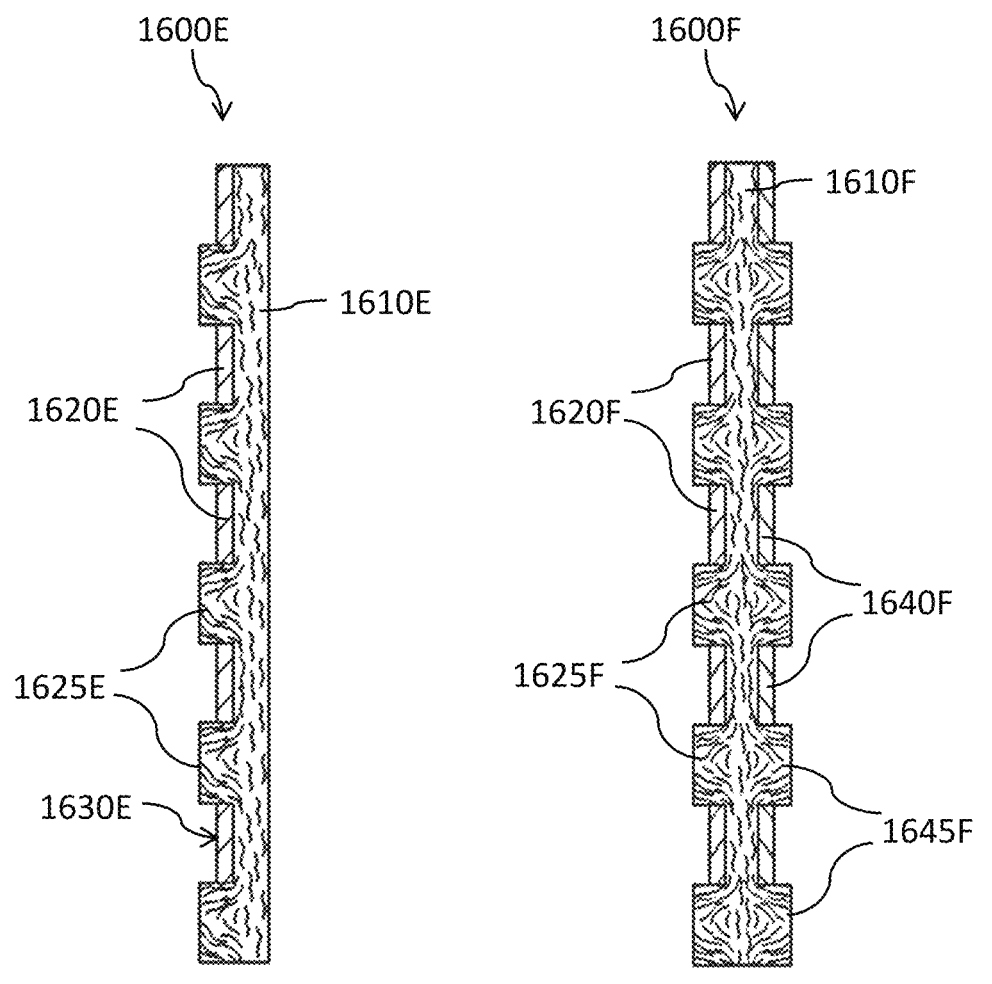

FIG. 16E is a schematic cross-sectional diagram of composite material 1600E comprising perforated material 1620E embedded in a major surface of graphite sheet material 1610E. Graphite occupies the perforations and extends through the perforations so that there are graphite protrusions 1625E sticking out above exposed surface 1630E of perforated material 1620E.

FIG. 16F is a schematic cross-sectional diagram of composite material 1600F comprising perforated materials 1620F and 1640F embedded in the major surfaces of graphite sheet material 1610F. Perforated materials 1620F and 1640C can be the same or different from one another. In composite material 1600F, perforated materials 1620F and 1640F are embedded in the major surfaces of graphite sheet material 1610F so that graphite occupies the perforations and extends through the perforations so that there are graphite protrusions 1625F and 1645F sticking out above the exposed surfaces the respective perforated materials 1620F and 1640F.

Figures 16G, 16H:
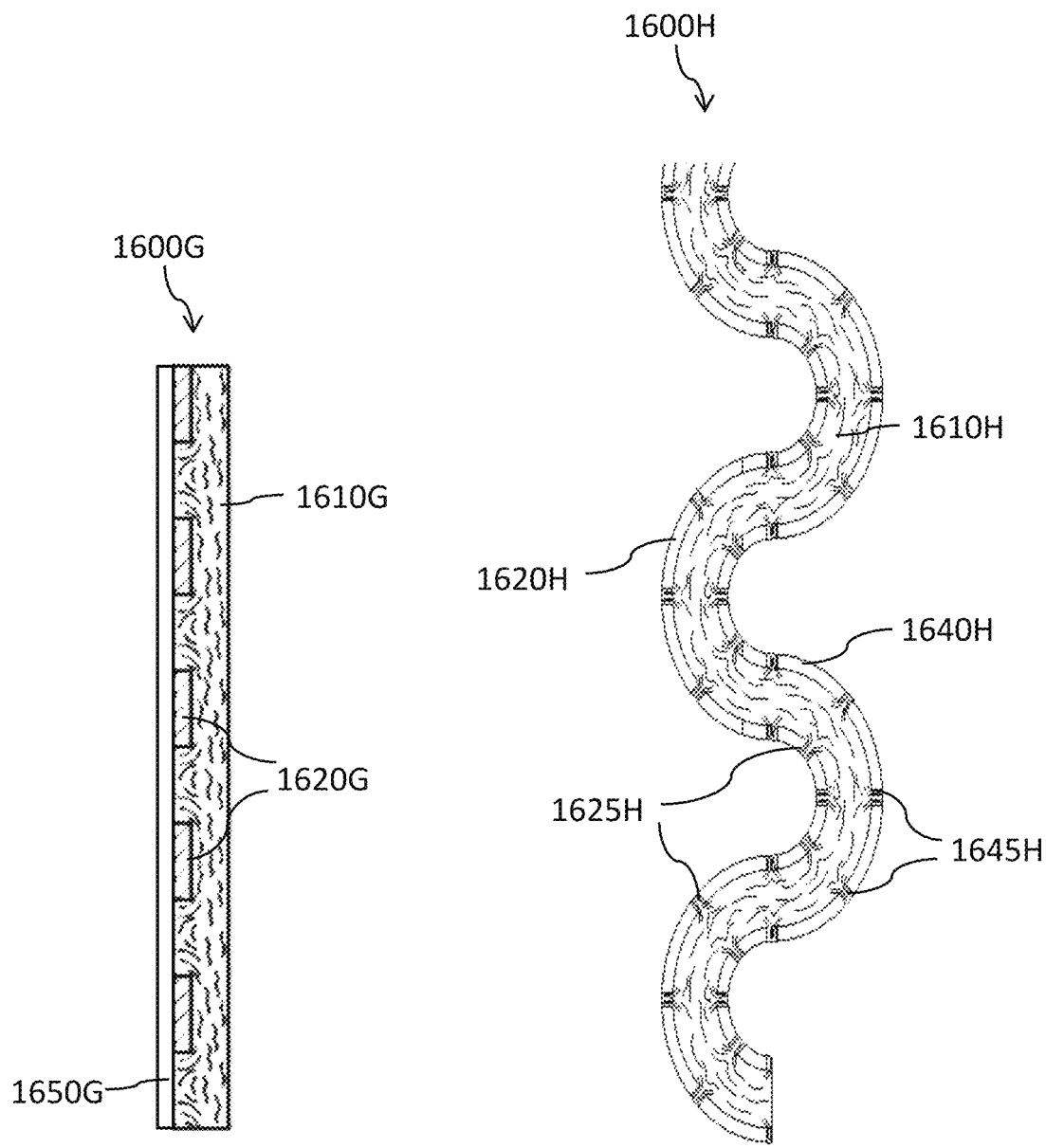
FIG. 16G is a schematic cross-sectional diagram of another example of a composite material comprising a perforated material embedded in a major surface of graphite sheet material, to increase the through-plane thermal conductivity of the graphite sheet material, the composite material further comprising a coating on one side.
FIG. 16H is a schematic cross-sectional diagram of an example of a corrugated composite material comprising perforated materials embedded in both major surfaces of a graphite sheet material, to increase the through-plane thermal conductivity of the graphite sheet material.

In some embodiments, a coating can be applied to at least a portion of one or both major surfaces of the composite material. For example, the coating can be a protective coating or an electrically insulating coating. FIG. 16G is a schematic cross-sectional diagram of composite material 1600G (similar to material 1600A of FIG. 16A), comprising perforated material 1620G embedded in a major surface of graphite sheet material 1610G. Composite material 1600G further comprises coating 1650G on one side.

In some embodiments of a composite material comprising a perforated material embedded in one or both major surfaces of a graphite sheet material, the composite is non-planar. For example it can be corrugated, pleated bent or otherwise formed or shaped. FIG. 16H is a schematic cross-sectional diagram of an example of corrugated composite material 1600H. Composite material 1600H is similar to material 1600C of FIG. 16C, and comprises perforated materials 1620H and 1640H embedded in the major surfaces of graphite sheet material 1610H, so that graphite occupies perforations 1625H and 1645H, and is substantially flush with the exposed surfaces of the respective perforated materials 1620H and 1640H.

In FIG. 16A, FIG. 16C and FIGS. 16E-H, the orientation of individual graphite flakes in the composite materials is indicated by the wavy lines. A significant portion of the flakes occupying the perforations are oriented out-of-plane relative to the plane of the composite material and some are oriented in a through-plane direction (or orthogonal to the direction of lamination of the layers).

This re-orientation or manipulation of the directionality of the graphite flakes can significantly enhance the through-plane thermal conductivity of the graphite sheet material overall and particularly in those regions. Having graphite protrusions extending from the surface of the composite material increases the surface area for heat dissipation. In some applications of such composite materials, air flow or another coolant stream can be directed around and across the protrusions. So, the protrusions can be left in place or in some cases they can be removed, for example, by polishing, shaving, milling, scraping or other suitable methods to leave the surface of the graphite flush with the outer surface of the perforated material.

The perforated material can be made of various materials including, but not limited to, metals, plastics, polymers, paper, adhesive films, ceramics, glass, graphite, carbon or silicon. The composition and thickness of the perforated material can be selected to suit the end-use application for the composite material, and to provide a composite material with desirable properties for the end-use application. Examples of composite materials and thermal management devices comprising some of these perforated materials are described in further detail below.

In some embodiments, the perforated material can enhance the thermal conductivity of the composite, depending on what it is made of. In some embodiments, it can enhance other properties of the composite material (relative to flexible graphite). For example, in some embodiments it can enhance the strength, stiffness, durability, flexibility, formability, moldability and/or the like, depending on the choice of perforated material The shape, size and pattern or distribution of the apertures in the perforated material can also be selected to suit the end-use application for the composite material, and to provide a composite material with desirable properties for the end-use application. For example, the apertures can be circular, rectangular, diamond-shaped, slots, triangular or they can be irregularly shaped. The perforated material can have apertures of different shapes and/or apertures that are non-uniformly distributed across the material. The area of the apertures relative to the total area of the perforated material can similarly be selected to suit the end-use application for the composite material, and to provide the composite material with desirable properties for the end-use application.

In some embodiments of the present composite materials, the perforated material embedded in one or both surfaces of the flexible graphite extends laterally beyond the perimeter of the flexible graphite. In some embodiments of the present composite materials, the flexible graphite extends laterally beyond the perimeter of the perforated material embedded in one or both of its surfaces. In some embodiments of the present composite materials, more than one type of perforated material is embedded in the same surface major surface of the flexible graphite.

Generally it has been found that is it not necessary to use an adhesive, tangs, barbs or other mechanisms to secure the perforated material to the graphite sheet material. For example, perforated flat metal sheets have remained securely in place without the use of an adhesive, when embedded in the surface of flexible graphite.

Figure 17A:
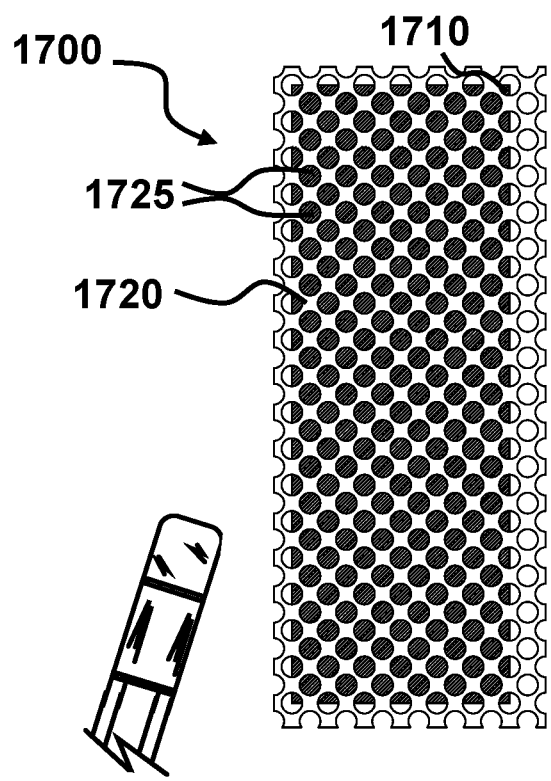
FIG. 17A illustrates an example of a composite material comprising a perforated material embedded in a major surface of a graphite sheet material, to increase the through-plane thermal conductivity of the graphite sheet material.
Figure 17B:
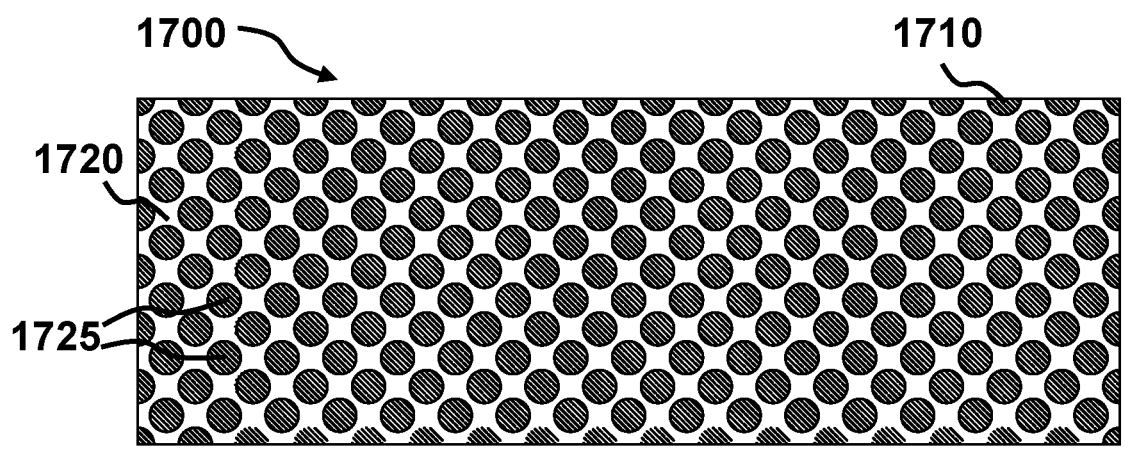
FIG. 17B is a close up view of the same material shown in FIG. 17A.

FIG. 17A illustrates an example of a composite material 1700 comprising perforated metal (stainless steel) sheet 1720 having an array of apertures 1725, embedded in a major surface of graphite sheet material 1710 (pencil shown to give a sense of scale). This is an example of a material such as material 1600A shown schematically in FIG. 16A. FIG. 17B is a close up view of material 1700 shown in FIG. 17A, illustrating graphite sheet material 1710 occupying perforations 1725, and flush with the surface of perforated metal sheet 1720. Material 1700 was made by pressing perforated metal sheet 1720 into graphite sheet material 1710.

Figure 17C:
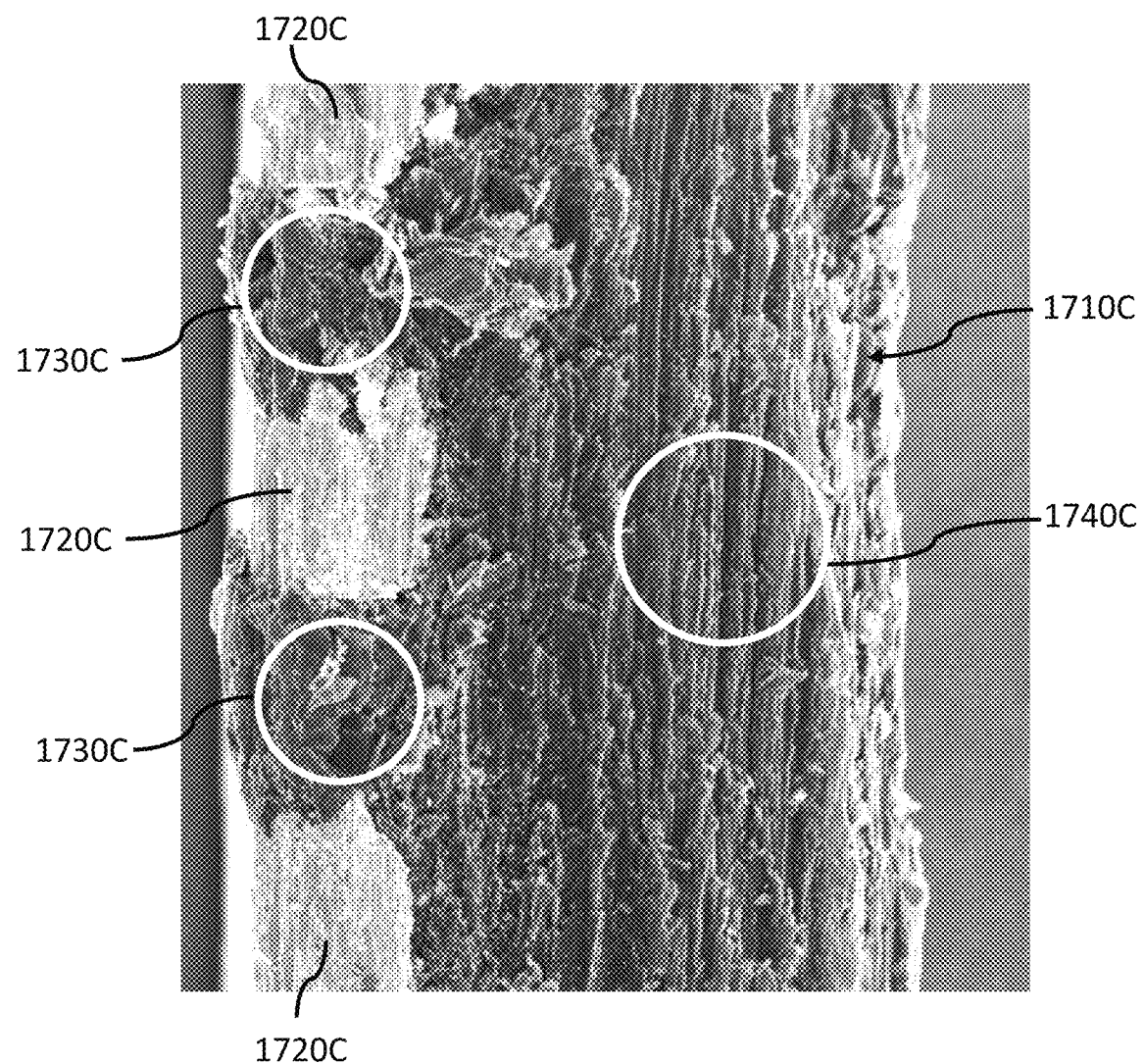
FIGS. 17C and 17D show scanning electron microscope images of portions of a composite material comprising a perforated metal (stainless steel) sheet embedded in a major surface of a graphite sheet material.
Figure 17D:
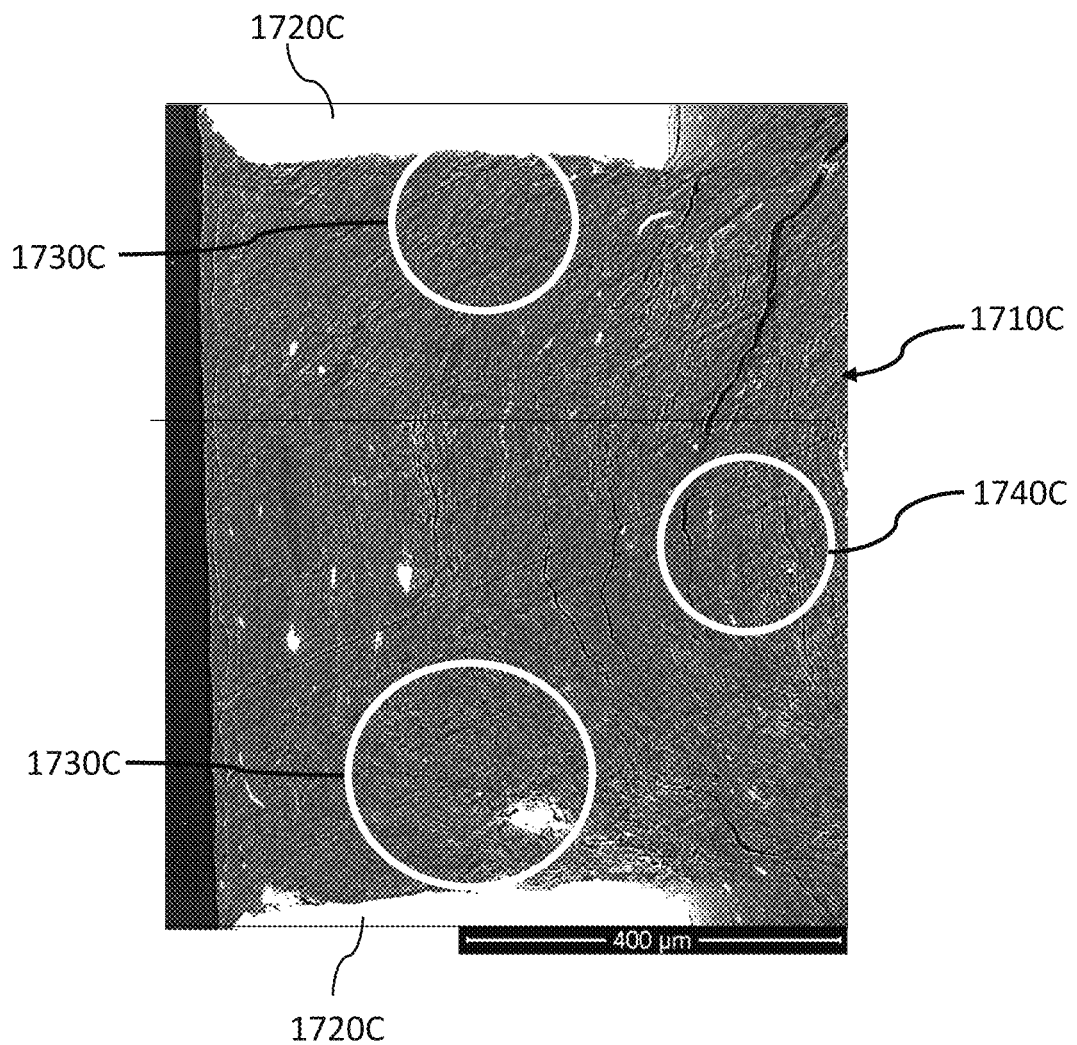

FIGS. 17C and 17D show a scanning electron microscope images of a portion of a composite material comprising perforated metal (stainless steel) sheet 1720C embedded in a major surface of graphite sheet material 1710C. FIG. 17C shows a scanning electron microscope image of a cross-section of two apertures in perforated metal sheet 1720C occupied by graphite. FIG. 17D shows a scanning electron microscope image of a cross-section of one aperture in perforated metal sheet 1720C occupied by graphite. The samples were prepared differently for the two images. As can be seen in both images, perforated metal sheet 1720C is embedded in the surface of graphite sheet material 1710C so that the exposed graphite surface is substantially flush with the outer surface of the metal sheet. The disruption in the orientation of the graphite flakes in the graphite occupying the apertures (as shown in circles 1730C), relative to the clear in-plane orientation of the graphite flakes in the rest of the graphite sheet material (as shown in circles 1740C), is visible in both images.

In some methods for making the above described composite materials, a graphite sheet material and the perforated material can be brought together so that the graphite sheet material is squeezed into the apertures of the perforated material and graphite flakes become oriented out-of-plane and preferably perpendicular to the plane of the material, for example, as described in reference to FIG. 9C. The graphite sheet material comprises exfoliated graphite. For example, it can be a conventional or commercially available graphite mat or flexible graphite material. In some embodiments, the composite materials can be made by pressing the materials together in a calendaring process, with the graphite sheet material and the perforated material(s) each optionally being drawn from a roll of material. In some embodiments, the composite materials can be made by compressing discrete pieces of graphite sheet material and perforated material together in a die press.

It is generally more convenient to start with a graphite sheet material, and then re-orient the flakes by further compressing and embedding a perforated material into the graphite sheet material. However, in some methods for making composite materials and devices as described herein, loose exfoliated graphite particles are compressed directly into a perforated material, without being formed into a sheet material first. In some embodiments, exfoliated graphite particles are blended to reduce the particle size, and are then compressed directly into a perforated material, without being formed into a graphite sheet material first.

Thus with this approach, a perforated material that is used to orient or re-orient flakes in the graphite material in an out-of-plane or through-plane direction is not removed once the flake manipulation has occurred, but remains part of the resulting composite material or device. The composite materials can be made in large sheets or rolls and cut to the desired shape and size.

Thermal Panels and Heat Dissipating Enclosures

Composite materials such as those described above can be used as thermal panels for heat dissipation, and in particular can be used to form enclosures for electronics equipment.

Often power electronics equipment for indoor or outdoor use is housed inside a protective enclosure. Often elaborate cooling systems are needed to dissipate heat generated within the enclosure during operation of the power electronics. Heat sinks, air blowers or fan, liquid cooling systems, heat exchangers, heat pipes, chillers, refrigeration systems and the like are commonly used to dissipate heat. Even with passive heat dissipation components, there are often a large number of thermal interfaces where one heat dissipating component touches another along a heat transfer pathway. Interfaces, where two materials or components are adjacent to one another, tend to impede heat transfer.

Figure 18A:
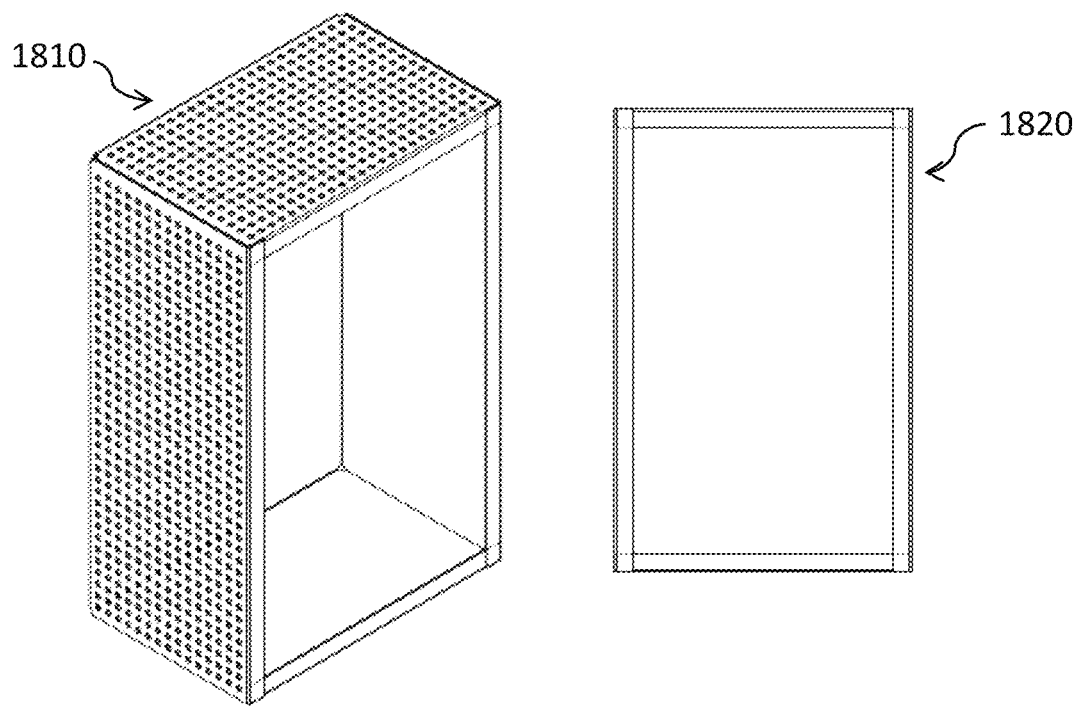
FIG. 18A illustrates an enclosure and an enclosure door panel for housing power electronics, the enclosure formed from a composite material.
Figure 18B:
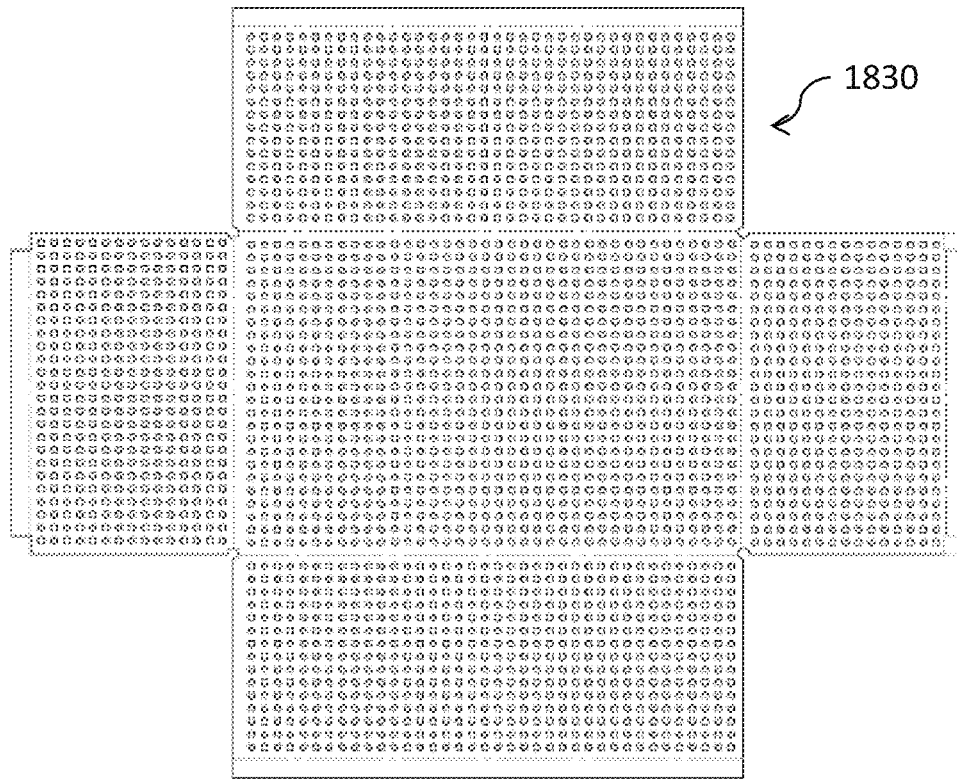
FIG. 18B shows a foldable panel of composite material, which can be formed into an enclosure such as shown in FIG. 18A.

FIG. 18A illustrates enclosure 1800 and enclosure door panel 1810. Composite materials, such as illustrated in FIGS. 16A-G and FIGS. 17A-B can be used to form enclosure 1810, for example, by joining or fastening together separate rectangular panels of composite material, or folding piece of composite material 1830 such as shown in FIG. 18B to form the enclosure, and adding hinged door panel 1820 which can be made from the composite material or another material. The composite material can be joined and optionally sealed along the seams, for example by welding, soldering, brazing or melting, if the perforated material of the composite is a suitable material such as a metal. Corner beading can optionally be used along the seams. With this approach, the enclosure itself can serve as a heat sink. It has a large surface area, and the orientation of the graphite flakes in the perforations of the composite material can enhance the through-plane heat transfer to the exterior of the enclosure. A direct thermal path from a heat source to the enclosure can be formed, for example, as shown in FIG.19.

Figure 19:
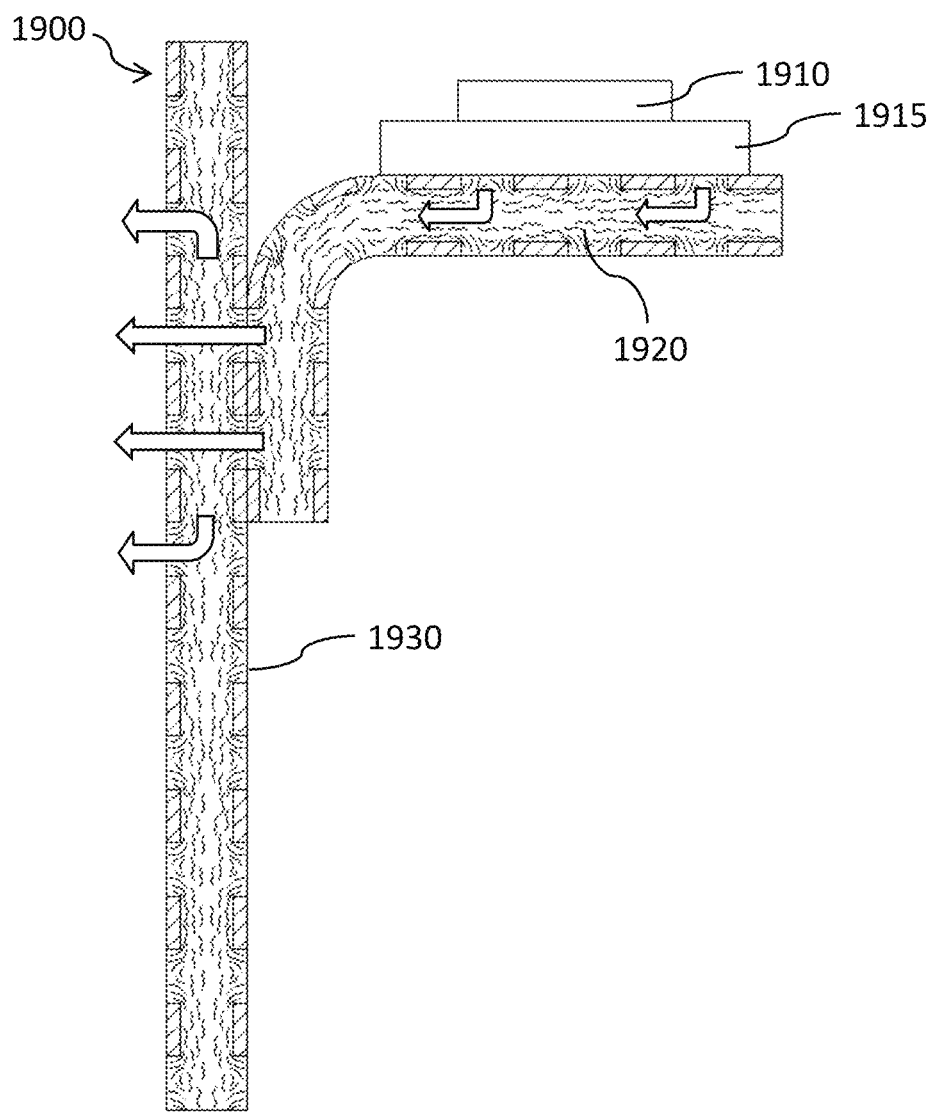
FIG. 19 is a schematic diagram showing a thermal path from a heat source through a bracket and a portion of an enclosure wall made from a composite material.

FIG. 19 is a schematic diagram showing a portion of enclosure wall 1900 made from a composite material comprising a perforated metal sheet material embedded in both major surfaces of a graphite sheet material (such as described in reference to FIG. 16C). Heat source 1910 (such as a CMOS or IGBT rectifier) on substrate 1915 is mounted to bracket 1920 made of the same composite material. The bracket is attached (for example, welded or otherwise fastened) to interior surface 1930 of enclosure wall 1900. A flexible graphite thermal interface material, as described herein, can be used between substrate 1915 and bracket 1920. The graphite flakes are orientated to provide a highly thermally conductive path to the exterior of the enclosure as indicated by the arrows in FIG. 19. The perforated material can also contribute to the dissipation of heat from the heat source to the exterior, if it is a metal, for example.

In some embodiments of a thermal panel or enclosure, the composite material is a metal, such as aluminum or stainless steel. In other embodiments the perforated material can be a plastic. An example of a suitable composite material for an enclosure is similar to that illustrated in FIG. 16C, with sheets of 18 gauge (0.05" thick) perforated steel embedded in both sides of flexible graphite with ⅛" diameter perforations on 3/16" centres, and the thickness of the graphite after embedding and compression is in the range of 0.3 mm-1 mm. Advantages of using metals include that metals can generally be welded, they are generally durable and mechanically strong, and they are generally more thermally conductive than plastics. If a single-sided composite material is used (with perforated material embedded in just one major surface of the graphite sheet material), preferably the perforated material is positioned on the exterior of the enclosure. A coating can be applied to the exterior and/or interior of the enclosure. For example, a protective coating can be applied to the exterior if the enclosure is to be located outdoors.

In some embodiments, some regions of the perforated material used in the composite material do not have apertures formed therein. For example the perforated material can be solid along the edges of piece 1830 where it is to be folded or welded. In some embodiments, the graphite material does not extend into these regions. In other words, the metal sheet can extend beyond the graphite sheet material, for example at the edges.

Thermal Interface Materials comprising Exfoliated Graphite and Perforated Adhesive Layer(s)

Flexible graphite sheet materials that are patterned to increase their through-plane conductivity can advantageously be used as TIMs, as described above. They can be clamped or otherwise fastened between two components, such as a heat source and a heat sink. In some applications an adhesive or adhesive film can be applied to one or both sides of the graphite sheet material TIM to secure it to the heat source and heat sink. Often an adhesive will tend to increase the thermal resistance of the interface.

In another approach, composite materials comprising an adhesive layer embedded in a graphite sheet material made by compressing exfoliated graphite can be used as self-bonding or adhesive TIMS.

A perforated adhesive film can be embedded in one or both surfaces of a graphite sheet material so that the perforations are occupied by graphite flakes, a significant portion of which are oriented out-of-plane relative to the plane of the composite material. In some preferred embodiments, a significant portion of the flakes in the perforations are oriented perpendicular to the plane of the composite material. The graphite sheet material can be pre-formed flexible graphite that is squeezed against the perforated adhesive film(s), so that the graphite flakes move into and are re-oriented in the perforations, or can be formed in situ from exfoliated graphite worms or blended worms. In some preferred embodiments, the adhesive film is sticky on both sides. It adheres to the graphite sheet material, and it can have a release layer on the opposite surface from the graphite. The release layer can be easily removed when the composite material or device is to be used.

Figure 20A:
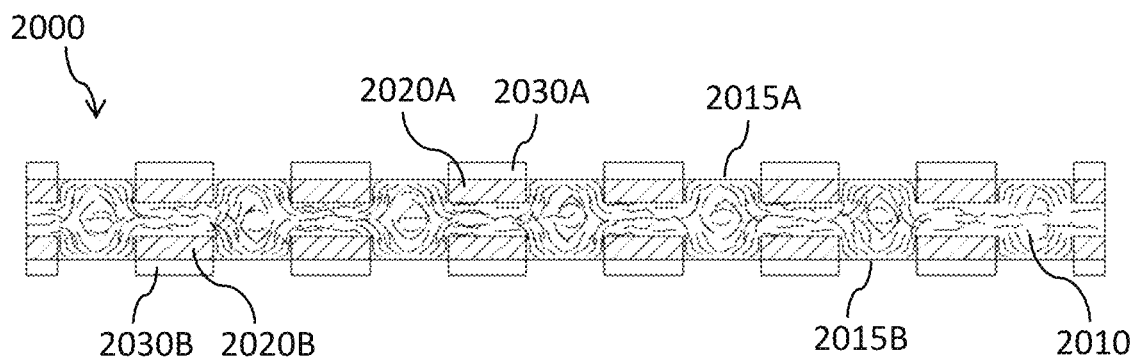
FIG. 20A shows a schematic cross-sectional view of composite material (an adhesive TIM) comprising perforated adhesive films embedded in both major surfaces of a graphite sheet material.

FIG. 20A shows a schematic cross-sectional view of composite material 2000 (in this embodiment, an adhesive TIM) comprising a pair of perforated adhesive films, 2020A and 2020B embedded in the major surfaces of graphite sheet material 2010. Perforated adhesive films 2020A and 2020B have release paper 2030A and 2030B, respectively, on their outer surfaces. In material 2000, graphite occupies perforations 2025A and 2025B and is flush with the outer surface of adhesive film 2020A and 2020B. This configuration ensures, or at least increases the chance that when release paper 2030A and 2030B are removed, and the adhesive film is used to bond the TIM to a surface, there is sufficient contact with the graphite material. With this approach exposed graphite surfaces 2015A and 2015 can be in direct contact with a heat source and heat sink, for example.

Figures 20B, 20C:
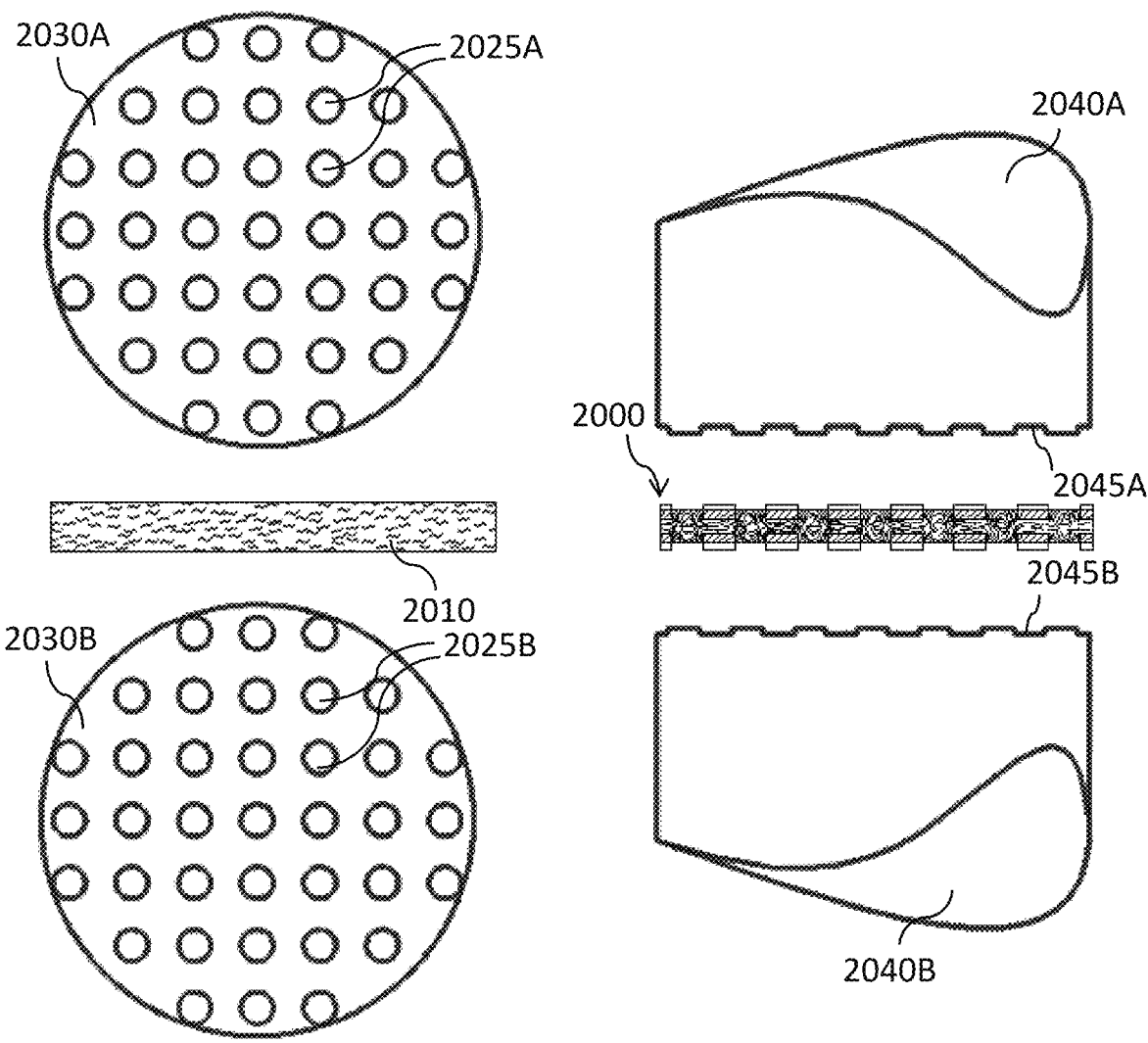
FIG. 20B shows a schematic cross-sectional view of piece of flexible graphite and a plan view of a pair of perforated adhesive films that are compressed together to form the adhesive TIM shown in FIG. 20A.
FIG. 20C shows a cross-sectional view of a pair of patterned dies that can be used to form the adhesive TIM shown in FIG. 20A.

Adhesive TIM 2000 can be made by compressing circular piece of flexible graphite 2010 (shown in cross-section in FIG. 20B) between a pair of circular pieces of perforated adhesive film (shown in plan view in FIG. 20B with release paper 2030A and 2030B uppermost), using a pair of patterned dies 2040A and 2040B, as shown in cross-section in FIG. 20C. Dies 2040A and 2040B are each patterned with a plurality of circular recesses 2045A and 2045B, respectively, corresponding with perforations 2025A and 2025B in adhesive films 2020A and 2020B. The depths of recesses 2045A and 2045B are substantially the same as the thickness of release paper 2030A and 2030B, so that graphite is squeezed into the perforations in adhesive films 2020A and 2020B so that it is flush with the outer surface of each of the adhesive films. The orientation of individual graphite flakes in TIM 2000 is indicated by the wavy lines in FIG. 20A.

Perforated adhesive film can similarly be embedded in graphite sheet material that has previously been patterned to enhance its through-plane conductivity (for example, materials such as those shown in FIGS. 10A-D). A piece of graphite sheet material can be squeezed into one or more openings in the adhesive film. During this process the through-plane orientation of graphite flakes in the surface of the graphite sheet material is preferably maintained or enhanced.

Figure 21A:
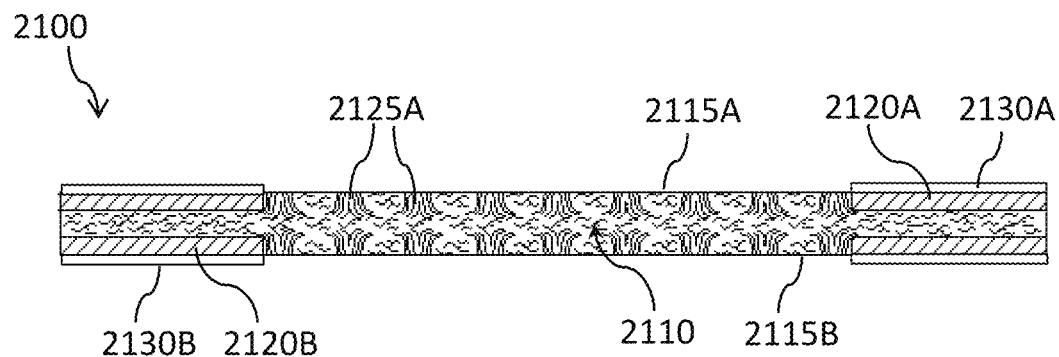
FIG. 21A shows a schematic cross-sectional view of an adhesive TIM comprising a pair of annular adhesive films embedded in the major surfaces of a circular piece of patterned graphite sheet material.
Figure 21B:
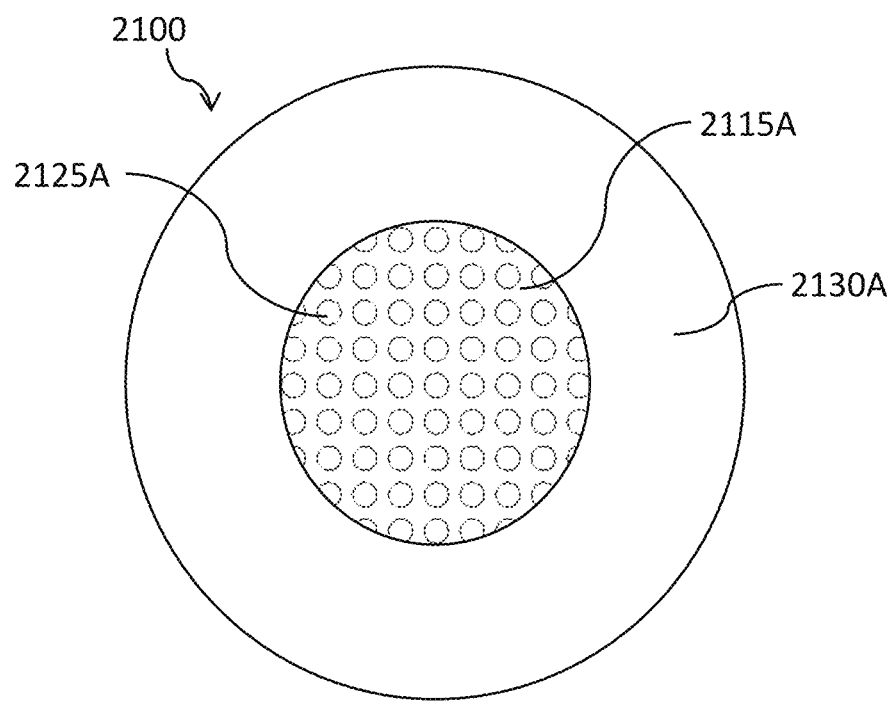
FIG. 21B is a plan view of the adhesive TIM shown in FIG. 21A.

FIG. 21A shows a schematic cross-sectional view of adhesive TIM 2100 comprising circular piece of graphite sheet material 2110 that has previously been patterned and then pressed flat in a central region thereof (to enhance its through-plane conductivity in that region). Two annular pieces of adhesive film 2120A and 2120B are embedded in opposite surfaces of the graphite sheet material 2110. Adhesive films 2120A and 2120B have release paper 2130A and 2130B on their respective outer surfaces. Graphite sheet material 2110 is squeezed into the central opening in adhesive films 2120A and 2120B so that exposed graphite surfaces 2115A and 2115B are flush with the outer surface of each of respective adhesive films. The orientation of individual graphite flakes in graphite sheet material 2110 is indicated by the wavy lines in FIG. 21A. FIG. 21B is a plan view of adhesive TIM 2100 shown in FIG. 21A. When adhesive TIM 2100 is to be used, release paper 2130A and 2130B are removed and the adhesive TIM is positioned between and adhered to two components in a heat dissipation path.

Similar adhesive TIMs can be made by embedding adhesive film into graphite sheet material in a calendaring process using patterned or smooth rollers, with the graphite sheet material and the adhesive film(s) each optionally being drawn from a roll of material. The adhesive film can be supplied perforated or can be perforated as part of the process, as it is drawn from the roll. The adhesive film can be supplied with a release layer on both surfaces, with the release layer being removed from the surface that is to be pressed into the graphite sheet material during the process. The adhesive TIM can made as a larger sheet and then be cut to the desired size and shape In some embodiments of TIMs comprising exfoliated graphite and perforated adhesive layers, the thickness of the adhesive layer is the in the range of 100 µm to 500 µm.

Thermal Packaging Assemblies Comprising Exfoliated Graphite and Perforated Materials As described above, the thermal performance of electronics packaging assemblies can be improved by replacing separate components that are generally used in conventional assemblies (such as TIMs, lids, and heat sinks) with integrated devices made from exfoliated graphite that serve the function of two or more conventional components. In the manufacture of some such devices, a screen or perforated material can be used to orient or re-orient graphite flakes in a through-plane direction (perpendicular to the direction of compression) in certain regions of the device, to provide desired directionality of thermal conductivity in the device.

It such devices, it can be beneficial in some situations to leave the perforated material in place in the finished device. For example, in some embodiments, a perforated metal or plastic screen can improve the overall, strength, rigidity and/or durability of the device. In some embodiments, it can help maintain the desired orientation of the graphite flakes at the surface of the graphite material, and reduce the tendency of the device to compress further, for example, if it is tightly clamped.

Figure 22A:
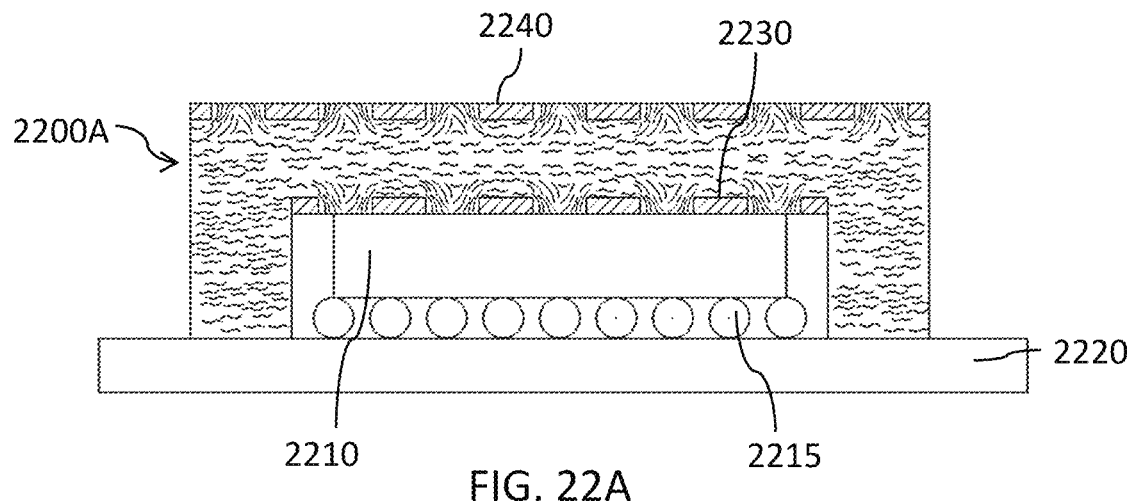
FIG. 22A is a schematic diagram showing a cross-sectional view of an integrated lid comprising a composite exfoliated graphite material, positioned in direct contact with a flip chip assembly.

FIG. 22A is a schematic diagram showing a cross-sectional view of integrated lid 2200A positioned in direct contact with flip chip 2210 that is mounted to substrate 2220 via solder connections 2215. Integrated lid 2200A is similar to lid 1450 described in reference to FIG.14C, and is formed by compressing exfoliated graphite material. The orientation of the graphite flakes in lower and upper thermal interface regions is modified by embedding perforated screens 2230 and 2240 into the exfoliated graphite material so that the through-plane thermal conductivity in these regions is greater than in the rest of the lid. Perforated screens 2230 and 2240 are left in place. Integrated lid 2200A can replace conventional lids and two layers of TIM in a typical packaging assembly. It can provide a low resistance thermal path from chip 2210 directly to integrated lid 2200A, and then directly to a heat sink which can be placed on top of lid 2200A.

Figure 22B:
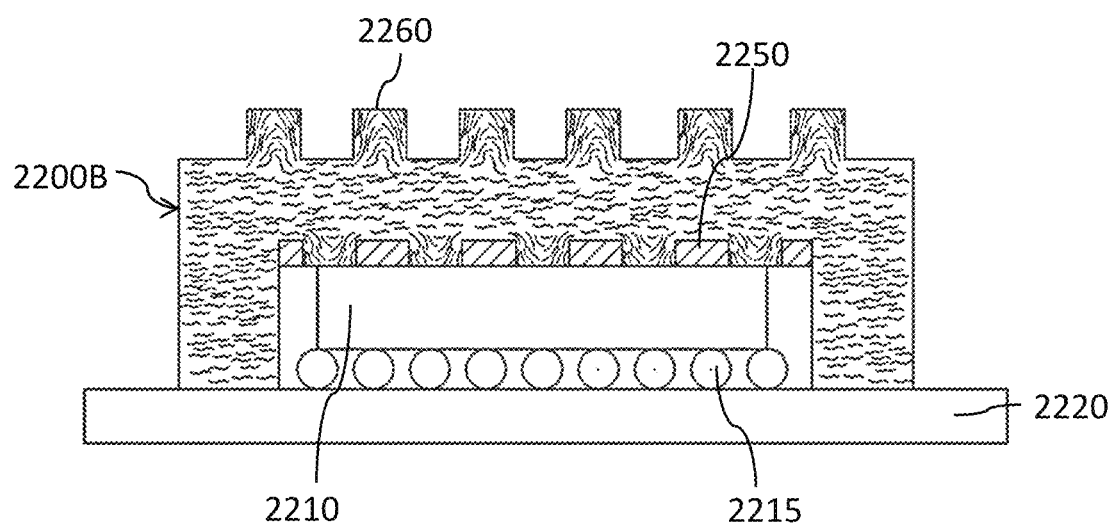
FIG. 22B is a schematic diagram showing a cross-sectional view of an integrated lid/heat sink comprising a composite exfoliated graphite material, positioned in direct contact with a flip chip assembly.

FIG. 22B is a schematic diagram showing a cross-sectional view of an integrated lid/heat sink 2200B positioned in direct contact with flip chip 2210 that is mounted to substrate 2220 via solder connections 2215. Integrated lid/heat sink 2200B is formed by compressing exfoliated graphite material. The orientation of the graphite flakes in lower thermal interface region is modified by embedding perforated screen 2250 into the exfoliated graphite material so that the through-plane thermal conductivity in this region is greater than in the body of the lid. Perforated screen 2250 is left in place. A series of protruding fins or pillars 2260 extend from the upper surface. These can be formed by squeezing the exfoliated graphite material into apertures or slots so that the graphite flakes in the fins or pillars are oriented out-of-plane. Integrated lid/heat sink 2200B can replace a conventional lid, two layers of TIM, and the heat sink in a typical packaging assembly. It can provide a low resistance thermal path from chip 2210 directly to integrated lid/heat sink 2200B and excellent heat dissipation from fins or pillars 2260. An air flow or another coolant stream can be directed around fins or pillars 2260.

Figure 22C:
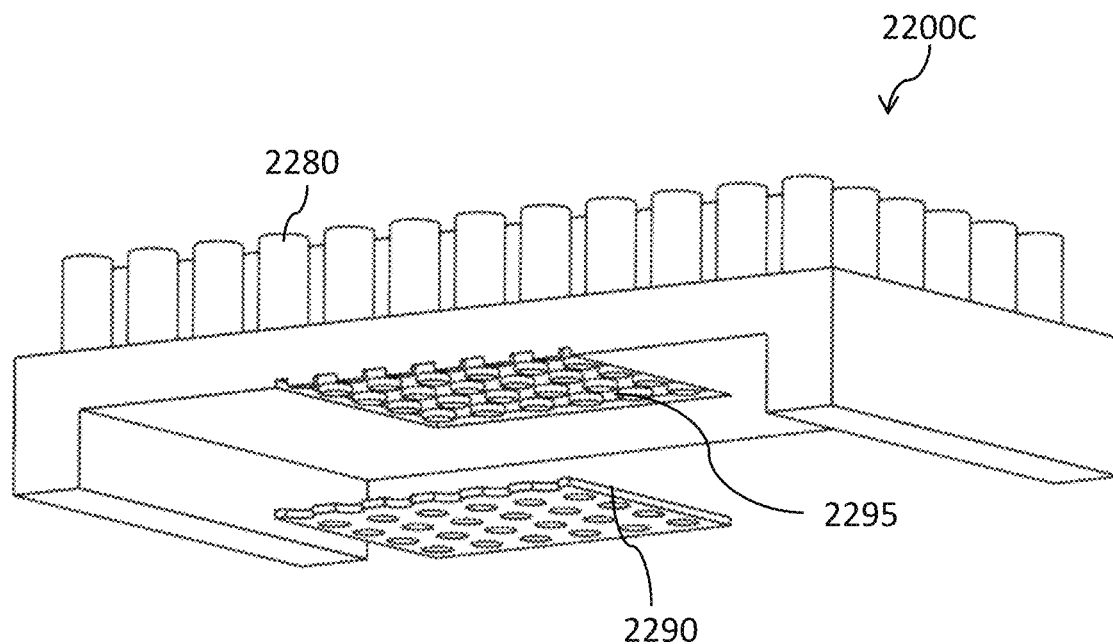
FIG. 22C is an underside exploded perspective view of an integrated lid/heat sink comprising a composite exfoliated graphite material.
Figure 22D:
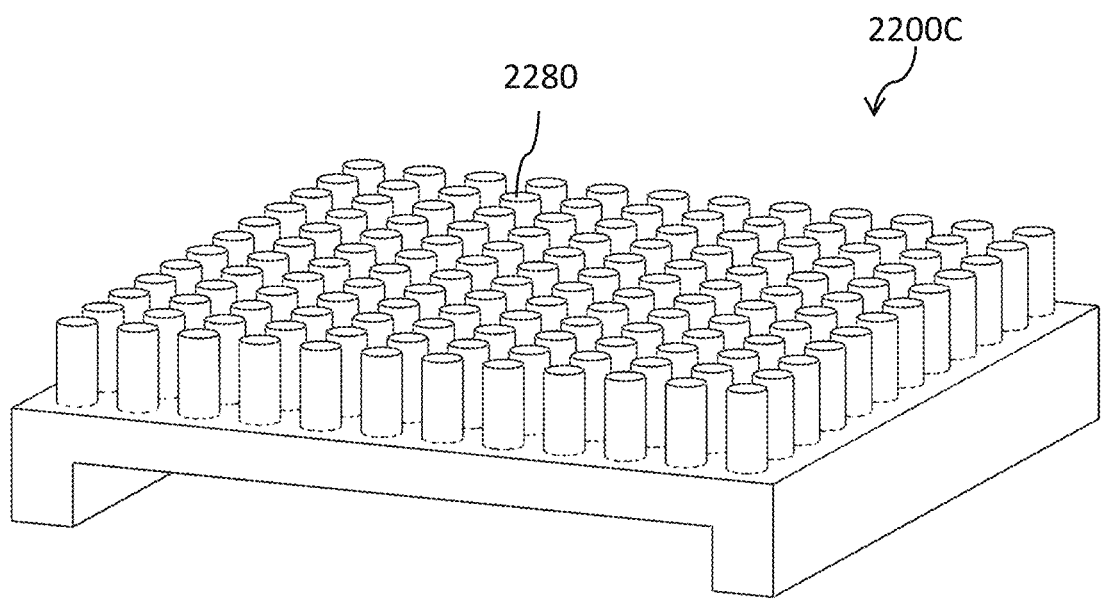
FIG. 22D is a top perspective view of an integrated lid/heat sink comprising a composite exfoliated graphite material.

FIG. 22C is an underside exploded perspective view and FIG. 22D is a top perspective view of integrated lid/heat sink 2200C similar to 2200B. Integrated lid/heat sink 2200C is formed by compressing exfoliated graphite material as described for 2200B. Perforated screen 2290 is used to modify the orientation of the graphite flakes in a lower thermal interface region by forming button pattern 2295. In the illustrated embodiment, perforated screen 2290 is left in place in the final device. Pillars 2280 protrude from the upper surface of integrated lid/heat sink 2200C.

Many of the above-described methods, materials and devices involve manipulation of graphite flake orientation in order to adjust the directional thermal properties of the material. For flake manipulation to be achievable, the graphite material that is being compressed is of a sufficiently low density (or has sufficient pore volume) that the flakes have room to move and be re-oriented during the compression process. It has been found, for example, that the flake manipulation techniques described herein work well for flexible graphite having a density of less than about 1.9 g/cm³ and preferably less than about 1.8 g/cm³.

The size of the features in the dies or apertures in the perforated materials that are used to pattern the graphite material also generally influences how much of the graphite is re-oriented in an out-of-plane or through-plane direction. Within a single recess die feature or aperture, graphite flakes that are close to the walls of the recess or aperture tend to become oriented in a through-plane direction more readily than flakes that are closer to the centre of the aperture, particularly if the aperture is large.

The graphite materials that are described herein can comprise other materials besides exfoliated graphite. For example, they can contain additives. Binders or resins are not generally required, but can be included. The additional materials can be present before the material is patterned and/or formed into a composite material or device, or can be added afterwards. For example, for some applications the materials, devices or portions of devices described herein could be impregnated with a resin, for example to enhance their rigidity and/or moisture resistance, and/or to fix the flake orientation within the material. For some applications the materials and devices described herein can be fully or partially coated or laminated with another material after they are formed.

The exfoliated graphite materials, and composite materials comprising exfoliated graphite, described herein can be used as or in various thermal management devices including, but not limited to, thermal interface materials, lids, heat sinks thermal pads, thermal bridges, fin stock, heat spreaders and the like, and in integrated or unitary devices providing more than one of these functions.

While particular elements, embodiments and applications of the present invention have been shown and described, it will be understood, that the invention is not limited thereto since modifications can be made by those skilled in the art without departing from the scope of the present disclosure, particularly in light of the foregoing teachings.

What is claimed is:

1. A method for making a composite material, said composite material comprising:
   (i) a graphite material comprising a plurality of graphite flakes, and
   (ii) a first sheet of perforated material comprising a plurality of apertures,
   said method comprising:
      embedding said first sheet of perforated material in said graphite material by pressing together said first sheet of perforated material and said graphite material, whereby said plurality of apertures in said first sheet of perforated material are substantially filled with said graphite material to produce a compressed layer of said graphite material on a first major surface of said first sheet of perforated material.

2. The method of claim 1, wherein said graphite material is a flexible graphite sheet material, and said embedding said first sheet of perforated material in said graphite material comprises embedding said first sheet of perforated material in a first major surface of said flexible graphite sheet material by pressing together said first sheet of perforated material and said flexible graphite sheet material.

3. The method of claim 2, wherein said first sheet of perforated material and said flexible graphite sheet material are pressed together in a calendering process.

4. The method of claim 3, wherein said first sheet of perforated material is drawn from a roll of perforated sheet material, and said flexible graphite sheet material is drawn from a roll of flexible graphite sheet material.

5. The method of claim 2, wherein said first sheet of perforated material and said flexible graphite sheet material are pressed together in a die press.

6. The method of claim 2, wherein said composite material further comprises a second sheet of perforated material comprising a plurality of apertures, and said method further comprises:
   embedding said second sheet of perforated material in a second major surface of said flexible graphite sheet material by pressing together said second sheet of perforated material and said flexible graphite sheet material, whereby said plurality of apertures in said second sheet of perforated material are substantially filled with said flexible graphite sheet material.

7. The method of claim 1, wherein said composite material further comprises a second sheet of perforated material comprising a plurality of apertures, and said method further comprises:
   embedding said second sheet of perforated material in said graphite material by pressing together said second sheet of perforated material and said graphite material, whereby said plurality of apertures in said second sheet of perforated material are substantially filled with said graphite material to produce a compressed layer of said graphite material between said first sheet of perforated material and said second sheet of perforated material.

8. The method of claim 1, wherein said first sheet of perforated material and said graphite material are pressed together in a die press.

9. The method of claim 1, further comprising forming said composite material into a non-planar shape.

10. The method of claim 1, wherein said perforated material is a metal.

11. The method of claim 1, wherein said perforated material is an adhesive film.

12. The method of claim 1, wherein said perforated material is plastic.

13. The method of claim 1, wherein said method comprises embedding said first sheet of perforated material in said graphite material by pressing together said first sheet of perforated material and said graphite material, whereby said plurality of apertures in said first sheet of perforated material are substantially filled with said graphite material so that said graphite material in said plurality of apertures is flush with a second major surface of said first sheet of perforated material.

14. The method of claim 1, wherein said method comprises embedding said first sheet of perforated material in said graphite material by pressing together said first sheet of perforated material and said graphite material, whereby said plurality of apertures in said first sheet of perforated material are substantially filled with said graphite material and said graphite material protrudes above a second major surface of said first sheet of perforated material.

15. The method of claim 1, wherein said method comprises making a plurality of discrete panels of said composite material and fastening said plurality of discrete panels together to form a heat dissipating enclosure having an interior surface and an exterior surface.

16. The method of claim 15, wherein said first sheet of perforated material is a metal, and said plurality of discrete panels of said composite material are fastened together along the respective edges of each of said plurality of discrete panels by welding, soldering, brazing, or melting said metal.

17. The method of claim 15, wherein said plurality of discrete panels forming said heat dissipating enclosure are oriented so that said first sheet of perforated material is located on said exterior surface of said heat dissipating enclosure, and said compressed layer of said graphite material is located on said interior surface of said heat dissipating enclosure.

18. The method of claim 7, wherein said method comprises making a plurality of discrete panels of said composite material and fastening said plurality of discrete panels together to form a heat dissipating enclosure having an interior surface and an exterior surface.

19. The method of claim 18, further comprising applying a protective coating to said exterior surface of said heat dissipating enclosure.

20. The method of claim 18, further comprising applying an electrically insulating coating to said interior surface of said heat dissipating enclosure.

\* \* \* \* \*